United States Patent
Shaikh et al.

(10) Patent No.: US 11,851,760 B2
(45) Date of Patent: Dec. 26, 2023

(54) PECVD DEPOSITION SYSTEM FOR DEPOSITION ON SELECTIVE SIDE OF THE SUBSTRATE

(71) Applicant: Lam Research Corporation, Fremont, CA (US)

(72) Inventors: Fayaz Shaikh, Lake Oswego, OR (US); Nick Linebarger, Beaverton, OR (US); Curtis Bailey, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/644,760

(22) Filed: Dec. 16, 2021

(65) Prior Publication Data

US 2022/0162754 A1  May 26, 2022

Related U.S. Application Data

(63) Continuation of application No. 17/080,749, filed on Oct. 26, 2020, which is a continuation of application
(Continued)

(51) Int. Cl.
*H01L 21/687* (2006.01)
*C23C 16/455* (2006.01)
(Continued)

(52) U.S. Cl.
CPC ........ *C23C 16/45574* (2013.01); *C23C 16/04* (2013.01); *C23C 16/45519* (2013.01);
(Continued)

(58) Field of Classification Search
CPC ............ C23C 16/45597; C23C 16/458; C23C 16/45521; C23C 16/45574; C23C 16/04;
(Continued)

(56) References Cited

U.S. PATENT DOCUMENTS

| 4,892,753 A | 1/1990 | Wang et al. |
| 5,000,113 A | 3/1991 | Wang et al. |

(Continued)

FOREIGN PATENT DOCUMENTS

| CN | 101358337 A | 2/2009 |
| CN | 101389415 A | 3/2009 |

(Continued)

OTHER PUBLICATIONS

CN Office Action dated Apr. 25, 2017 in CN Application No. 201510266980.4.
(Continued)

*Primary Examiner* — Rudy Zervigon
(74) *Attorney, Agent, or Firm* — Weaver Austin Villeneuve & Sampson LLP

(57) ABSTRACT

A plasma processing system is provided. The system includes a chamber, a controller and a showerhead disposed in the chamber. A first gas manifold is connected to the showerhead for providing a first gas from a first gas source responsive to control from the controller. A shower-pedestal is disposed in the chamber and oriented opposite the showerhead. A second gas manifold is connected to the shower-pedestal for providing a second gas from a second gas source responsive to control from the controller. A substrate support for holding a substrate at a spaced apart relationship from the shower-pedestal is provided. A radio frequency (RF) power supply for providing power to the showerhead to generate a plasma is provided. The plasma is used for depositing a film on a back-side of the substrate, when present in the chamber. The substrate is held by the substrate support in the spaced apart relationship from the shower-pedestal, during backside deposition. The showerhead provides a purge gas during the backside deposition.

11 Claims, 12 Drawing Sheets

Related U.S. Application Data

No. 15/692,300, filed on Aug. 31, 2017, now Pat. No. 10,851,457.

(51) Int. Cl.
| | |
|---|---|
| *H01L 21/02* | (2006.01) |
| *C23C 16/505* | (2006.01) |
| *C23C 16/52* | (2006.01) |
| *H01L 21/67* | (2006.01) |
| *C23C 16/04* | (2006.01) |

(52) U.S. Cl.
CPC .. *C23C 16/45565* (2013.01); *C23C 16/45597* (2013.01); *C23C 16/505* (2013.01); *C23C 16/52* (2013.01); *H01L 21/0217* (2013.01); *H01L 21/0262* (2013.01); *H01L 21/02164* (2013.01); *H01L 21/02211* (2013.01); *H01L 21/02216* (2013.01); *H01L 21/02274* (2013.01); *H01L 21/67017* (2013.01); *H01L 21/68735* (2013.01); *H01L 21/68771* (2013.01); *H01L 21/68785* (2013.01); *H01L 21/02532* (2013.01); *H01L 21/02595* (2013.01); *H01L 21/67161* (2013.01)

(58) Field of Classification Search
CPC ........ C23C 16/45519; C23C 16/45565; C23C 16/505; C23C 16/52; H01L 21/02164; H01L 21/0217; H01L 21/02211; H01L 21/02216; H01L 21/02274; H01L 21/0262; H01L 21/67017; H01L 21/68735; H01L 21/68771; H01L 21/68785; H01L 21/02532; H01L 21/02595; H01L 21/67161
USPC ...................... 118/728; 156/345.51
See application file for complete search history.

(56) References Cited

U.S. PATENT DOCUMENTS

| | | | |
|---|---|---|---|
| 5,074,017 A | 12/1991 | Toya et al. | |
| 5,338,363 A | 8/1994 | Kawata et al. | |
| 5,651,867 A | 7/1997 | Kokaku et al. | |
| 5,789,028 A * | 8/1998 | Zhao .................. | C23C 16/34 427/255.394 |
| 5,792,269 A | 8/1998 | Deacon et al. | |
| 5,964,952 A * | 10/1999 | Kunze-Concewitz ..................... | H01L 21/02046 134/103.3 |
| 5,981,899 A | 11/1999 | Perrin et al. | |
| 6,017,396 A | 1/2000 | Okamoto | |
| 6,153,012 A | 11/2000 | Rupp et al. | |
| 6,170,496 B1 * | 1/2001 | Chen .................. | B08B 5/02 134/22.12 |
| 6,179,924 B1 * | 1/2001 | Zhao .................. | C23C 16/52 118/728 |
| 6,183,565 B1 * | 2/2001 | Granneman ...... | C23C 16/45597 118/724 |
| 6,245,192 B1 | 6/2001 | Dhindsa et al. | |
| 6,251,191 B1 | 6/2001 | Matsuse | |
| 6,279,506 B1 | 8/2001 | Jurgensen et al. | |
| 6,329,304 B1 * | 12/2001 | Kuznetsov ........ | H01L 21/67248 118/724 |
| 6,461,439 B1 * | 10/2002 | Granneman .......... | C23C 16/458 118/724 |
| 6,565,661 B1 | 5/2003 | Nguyen | |
| 6,613,685 B1 * | 9/2003 | Granneman ........ | H01L 21/6838 438/711 |
| 6,746,237 B2 * | 6/2004 | Storm ............... | H01L 21/67109 432/5 |
| 6,800,187 B1 | 10/2004 | Reid et al. | |
| 6,805,749 B2 * | 10/2004 | Granneman ...... | C23C 16/45565 118/724 |
| 6,940,047 B2 * | 9/2005 | van Kesteren .... | H01L 21/67784 432/5 |
| 6,964,751 B2 * | 11/2005 | Storm ..................... | H01L 21/00 266/87 |
| 7,022,627 B2 * | 4/2006 | Granneman ........ | H01L 21/6838 438/795 |
| 7,033,444 B1 | 4/2006 | Komino et al. | |
| 7,153,772 B2 * | 12/2006 | Granneman ...... | H01L 21/28518 438/682 |
| 7,217,670 B2 * | 5/2007 | van Kesteren .... | H01L 21/67109 438/795 |
| 7,312,156 B2 * | 12/2007 | Granneman ............ | C23C 16/46 438/711 |
| 7,410,355 B2 * | 8/2008 | Granneman ...... | H01L 21/67248 432/5 |
| 7,534,977 B2 * | 5/2009 | Yamazaki ......... | H01L 21/67115 219/390 |
| 7,691,750 B2 * | 4/2010 | Granneman ...... | H01L 21/28518 438/682 |
| 7,754,013 B2 * | 7/2010 | Granneman ............ | C30B 25/10 117/85 |
| 7,858,898 B2 | 12/2010 | Bailey, III et al. | |
| 7,927,455 B2 | 4/2011 | Kishimoto et al. | |
| 7,943,007 B2 | 5/2011 | Bailey, III et al. | |
| 8,092,640 B2 | 1/2012 | Kishimoto et al. | |
| 8,101,531 B1 | 1/2012 | Li et al. | |
| 8,133,322 B2 | 3/2012 | Nakamura et al. | |
| 8,137,465 B1 | 3/2012 | Shrinivasan et al. | |
| 8,147,648 B2 | 4/2012 | Dhindsa | |
| 8,308,931 B2 | 11/2012 | Reid et al. | |
| 8,349,196 B2 | 1/2013 | Fairbairn et al. | |
| 8,373,086 B2 | 2/2013 | Kim et al. | |
| 8,562,750 B2 | 10/2013 | Chen et al. | |
| 8,580,078 B2 | 11/2013 | Bailey, III et al. | |
| 8,701,268 B2 | 4/2014 | Larson et al. | |
| 8,721,908 B2 | 5/2014 | Bailey, III et al. | |
| 8,728,956 B2 | 5/2014 | LaVoie et al. | |
| 8,784,622 B2 | 7/2014 | Barnes et al. | |
| 8,888,950 B2 * | 11/2014 | Lee .................. | H01L 21/68735 156/345.43 |
| 8,956,456 B2 | 2/2015 | Vermeer et al. | |
| 9,017,526 B2 | 4/2015 | Singh et al. | |
| 9,165,587 B2 | 10/2015 | Barnes et al. | |
| 9,175,391 B2 | 11/2015 | Endo et al. | |
| 9,238,867 B2 * | 1/2016 | Granneman ...... | H01L 21/67784 |
| 9,243,330 B2 * | 1/2016 | Granneman .......... | C30B 35/005 |
| 9,245,761 B2 | 1/2016 | Singh et al. | |
| 9,273,392 B2 | 3/2016 | Vermeer et al. | |
| 9,328,416 B2 | 5/2016 | Dhas et al. | |
| 9,449,808 B2 | 9/2016 | Buckalew et al. | |
| 9,644,271 B1 | 5/2017 | Keil et al. | |
| 9,776,905 B2 | 10/2017 | Maschmeyer et al. | |
| 9,870,917 B2 | 1/2018 | Kang et al. | |
| 9,881,788 B2 | 1/2018 | Kim et al. | |
| 10,109,517 B1 | 10/2018 | Blank et al. | |
| 10,233,111 B2 * | 3/2019 | Lezzi ..................... | C03B 29/16 |
| 10,358,722 B2 | 7/2019 | Wiltse et al. | |
| 10,611,664 B2 * | 4/2020 | Lezzi ..................... | C03C 3/078 |
| 10,851,457 B2 | 12/2020 | Shaikh ............. | H01L 21/67017 |
| 11,097,974 B2 * | 8/2021 | Lezzi ..................... | C03C 23/007 |
| 11,441,222 B2 | 9/2022 | Shaikh et al. | |
| 11,725,283 B2 | 8/2023 | Shaikh et al. | |
| 2001/0004479 A1 | 6/2001 | Cheung et al. | |
| 2004/0003777 A1 | 1/2004 | Carpenter et al. | |
| 2004/0035358 A1 | 2/2004 | Basceri et al. | |
| 2004/0087168 A1 * | 5/2004 | Granneman ...... | C23C 16/45565 438/706 |
| 2004/0134611 A1 | 7/2004 | Kato et al. | |
| 2004/0142558 A1 * | 7/2004 | Granneman ............ | C30B 25/14 118/715 |
| 2005/0022740 A1 | 2/2005 | Hatano | |
| 2005/0037619 A1 * | 2/2005 | Granneman ........ | C23C 16/4583 438/689 |
| 2005/0148139 A1 | 7/2005 | Sashida | |
| 2005/0183789 A1 | 8/2005 | Hong | |
| 2006/0137609 A1 | 6/2006 | Puchacz et al. | |

(56) References Cited

U.S. PATENT DOCUMENTS

| | | |
|---|---|---|
| 2006/0264063 A1 | 11/2006 | Stern et al. |
| 2007/0015374 A1 | 1/2007 | Granneman |
| 2007/0193688 A1 | 8/2007 | Dhindsa et al. |
| 2008/0066684 A1* | 3/2008 | Patalay ............. H01L 21/68735 118/728 |
| 2008/0069951 A1* | 3/2008 | Chacin ............. H01L 21/68735 118/728 |
| 2008/0073324 A1 | 3/2008 | Nogami et al. |
| 2008/0152838 A1* | 6/2008 | Sen .................... C23C 16/5096 427/569 |
| 2008/0179010 A1 | 7/2008 | Bailey, III et al. |
| 2009/0008035 A1 | 1/2009 | Iwai |
| 2009/0011120 A1 | 1/2009 | Iwai |
| 2009/0071407 A1* | 3/2009 | Kuznetsov ............ C30B 35/002 118/728 |
| 2009/0096349 A1 | 4/2009 | Moshtagh et al. |
| 2009/0145752 A1 | 6/2009 | Barnes et al. |
| 2009/0145879 A1 | 6/2009 | Fairbairn et al. |
| 2009/0145881 A1 | 6/2009 | Barnes et al. |
| 2009/0241833 A1 | 10/2009 | Moshtagh et al. |
| 2009/0291209 A1 | 11/2009 | Granneman et al. |
| 2010/0059478 A1* | 3/2010 | Lee .................. H01J 37/32431 156/345.33 |
| 2010/0193915 A1 | 8/2010 | Kishimoto et al. |
| 2010/0314725 A1 | 12/2010 | Gu et al. |
| 2011/0049100 A1 | 3/2011 | Han et al. |
| 2011/0100955 A1 | 5/2011 | Pushparaj et al. |
| 2011/0232571 A1 | 9/2011 | Hiura et al. |
| 2012/0090992 A1 | 4/2012 | Fairbairn et al. |
| 2012/0097641 A1 | 4/2012 | Beckmann et al. |
| 2012/0108066 A1 | 5/2012 | New et al. |
| 2012/0196050 A1 | 8/2012 | Vermeer et al. |
| 2013/0098761 A1 | 4/2013 | Fairbairn et al. |
| 2013/0183834 A1 | 7/2013 | Rogers et al. |
| 2014/0030445 A1 | 1/2014 | Vermeer et al. |
| 2014/0037847 A1 | 2/2014 | Vermeer et al. |
| 2014/0038418 A1 | 2/2014 | Bailey, III et al. |
| 2014/0044887 A1 | 2/2014 | Vermeer |
| 2014/0302681 A1 | 10/2014 | Paterson et al. |
| 2015/0167167 A1 | 6/2015 | Vermeer et al. |
| 2015/0228461 A1 | 8/2015 | Fukazawa et al. |
| 2015/0340225 A1* | 11/2015 | Kim .................. H01L 21/02345 118/728 |
| 2016/0172165 A1 | 6/2016 | Jeon et al. |
| 2016/0177444 A1 | 6/2016 | Baldasseroni et al. |
| 2016/0289827 A1 | 10/2016 | Augustyniak et al. |
| 2016/0319422 A1 | 11/2016 | Kurita et al. |
| 2016/0340782 A1 | 11/2016 | Chandrasekharan et al. |
| 2016/0362788 A1 | 12/2016 | Kurita et al. |
| 2017/0256393 A1 | 9/2017 | Kim et al. |
| 2017/0275756 A1 | 9/2017 | Blaquiere et al. |
| 2018/0334746 A1 | 11/2018 | Breiling et al. |
| 2019/0062918 A1* | 2/2019 | Shaikh .................... C23C 16/04 |
| 2019/0145001 A1 | 5/2019 | Park et al. |
| 2021/0108314 A1* | 4/2021 | Shaikh ............. C23C 16/45574 |
| 2021/0166940 A1* | 6/2021 | Nozawa ............. H01L 21/6833 |
| 2021/0301402 A1 | 9/2021 | Suzuki et al. |
| 2022/0162753 A1 | 5/2022 | Shaikh et al. |
| 2022/0162755 A1 | 5/2022 | Shaikh et al. |
| 2022/0298632 A1 | 9/2022 | Shaikh et al. |

FOREIGN PATENT DOCUMENTS

| | | | |
|---|---|---|---|
| CN | 101463473 | A | 6/2009 |
| CN | 101901752 | A | 12/2010 |
| CN | 103597113 | A | 2/2014 |
| CN | 105088177 | A | 11/2015 |
| CN | 105719989 | A | 6/2016 |
| CN | 109273378 | A | 1/2019 |
| EP | 0550058 | A2 | 7/1993 |
| JP | 04078130 | A * | 3/1992 |
| JP | H0645266 | A | 2/1994 |
| JP | 2002208590 | A | 7/2002 |
| JP | 2003027242 | A | 1/2003 |
| JP | 2003115483 | A | 4/2003 |
| JP | 2007242858 | A | 9/2007 |
| JP | 2011119472 | A | 6/2011 |
| JP | 2012089661 | A | 5/2012 |
| JP | 2012256895 | A | 12/2012 |
| JP | 2013232670 | A | 11/2013 |
| JP | 2016219803 | A | 12/2016 |
| KR | 20000070265 | A | 11/2000 |
| KR | 100335282 | B1 | 7/2002 |
| KR | 20050084807 | A | 8/2005 |
| KR | 20080018359 | A | 2/2008 |
| KR | 20080084323 | A | 9/2008 |
| KR | 20080092766 | A | 10/2008 |
| KR | 20080100370 | A | 11/2008 |
| KR | 20090053331 | A | 5/2009 |
| KR | 20090106730 | A | 10/2009 |
| KR | 20090118676 | A | 11/2009 |
| KR | 20100122873 | A | 11/2010 |
| KR | 20140011364 | A | 1/2014 |
| KR | 101423358 | B1 | 7/2014 |
| KR | 20150090538 | A | 8/2015 |
| KR | 20150101785 | A | 9/2015 |
| KR | 101562192 | B1 | 10/2015 |
| KR | 101580511 | B1 | 12/2015 |
| KR | 20150139774 | A | 12/2015 |
| KR | 20160072056 | A | 6/2016 |
| KR | 20160117261 | A | 10/2016 |
| KR | 20180087153 | A | 8/2018 |
| KR | 20190056021 | A | 5/2019 |
| KR | 20190056030 | A | 5/2019 |
| KR | 20200133493 | A | 11/2020 |
| TW | 200715403 | A | 4/2007 |
| TW | 200837875 | A | 9/2008 |
| TW | 200908136 | A | 2/2009 |
| TW | 200930826 | A | 7/2009 |
| TW | 201335997 | A | 9/2013 |
| TW | 201539617 | A | 10/2015 |
| TW | 201542860 | A | 11/2015 |
| TW | 201701318 | A | 1/2017 |
| WO | WO-9801890 | A1 | 1/1998 |
| WO | WO-2019046134 | A1 | 3/2019 |

OTHER PUBLICATIONS

CN Office Action dated Dec. 20, 2021, in CN Application No. 201880055786.3 with English translation.
CN Office Action dated Jan. 4, 2018 in CN Application No. 201510266980.4.
EP Extended Search Report dated Jun. 18, 2021 in EP Application No. 18852315.3.
International Preliminary Report on Patentability dated Jul. 23, 2020 in PCT Application PCT/US2018/048029.
International Search Report and Written Opinion dated Dec. 11, 2018 (ISA/KR) in PCT Application PCT/US2018/048029.
KR Office Action dated Jun. 17, 2022, in Application No. KR10-2020-7009256 With English Translation.
KR Office Action dated Jun. 26, 2022 in Application No. KR10-2021-7041758 With English Translation.
KR Office Action dated Jun. 26, 2022 in Application No. KR10-2021-7041761 With English Translation.
KR Office Action dated Feb. 18, 2022, in KR Application No. 1020207009256 with English Translation.
KR Office Action dated Feb. 21, 2022, in KR Application No. 10-2021-7041758 with English Translation.
KR Office Action dated Feb. 21, 2022, in KR Application No. 10-2021-7041761 with English translation.
KR Office Action dated Jun. 21, 2021 in KR Application No. 10-2022-0035739.
KR Office Action dated Jun. 28, 2022, in Application No. KR10-2022-0035739 with English translation.
TW Search Report & Grant Decision dated Nov. 30, 2018 in TW Application No. 104115987.
TW Search Report & Grant Decision dated Dec. 28, 2021, in TW Application No. 107130221 with English translation.
U.S. Appl. No. 15/846,100, inventors Kim et al., filed Dec. 18, 2017.

(56) References Cited

OTHER PUBLICATIONS

U.S. Final Office Action dated Jul. 5, 2022 in U.S. Appl. No. 17/644,761.
U.S. Final Office Action dated Jan. 15, 2020 in U.S. Appl. No. 15/692,300.
U.S. Final Office Action dated Jun. 27, 2017 in U.S. Appl. No. 14/285,544.
U.S. Final Office Action dated Sep. 21, 2016 in U.S. Appl. No. 14/285,544.
U.S. Notice of Allowance (corrected) dated Sep. 18, 2020 in U.S. Appl. No. 15/692,300.
U.S. Notice of Allowance dated Aug. 4, 2020 in U.S. Appl. No. 15/692,300.
U.S. Notice of Allowance dated May 3, 2022 in U.S. Appl. No. 17/644,759.
U.S. Notice of Allowance dated Sep. 21, 2017 in U.S. Appl. No. 14/285,544.
U.S. Office Action dated Apr. 22, 2016 in U.S. Appl. No. 14/285,544.
U.S. Office Action dated Dec. 23, 2016 in U.S. Appl. No. 14/285,544.
U.S. Office Action dated Mar. 10, 2022 in U.S. Appl. No. 17/644,761.
U.S. Office Action dated Mar. 26, 2020 in U.S. Appl. No. 15/692,300.
U.S. Office Action dated Oct. 27, 2015 in U.S. Appl. No. 14/285,544.
U.S. Office Action dated Sep. 12, 2019 in U.S. Appl. No. 15/692,300.
International Preliminary Report on Patentability dated Mar. 3, 2022, in PCT Application No. PCT/US2020/045281.
International Search Report and Written Opinion dated Nov. 13, 2020 in PCT Application No. PCT/US2020/045281.
JP Office Action dated Oct. 4, 2022 in Application No. JP20200511239 with English translation.
KR Office Action dated Oct. 26, 2022 in Application No. KR10-2020-7009256 with English translation.
KR Office Action dated Oct. 26, 2022 in Application No. KR10-2021-7041758 with English translation.
KR Office Action dated Oct. 27, 2022 in Application No. KR10-2021-7041761 With English Translation.
KR Office Action dated Jul. 4, 2022 in Application No. KR10-2022-7008634 With English Translation.
KR Office Action dated Nov. 25, 2022 in Application No. KR10-2022-7008634 With English Translation.
KR Office Action dated Oct. 25, 2022, in Application No. KR10-2022-0035739 with English translation.
U.S. Corrected Notice of Allowance dated Aug. 10, 2022 in U.S. Appl. No. 17/644,759.
U.S. Advisory Action dated Sep. 28, 2022, in U.S. Appl. No. 17/644,761.
U.S. Corrected Notice of Allowance dated Oct. 26, 2022 in U.S. Appl. No. 17/644,761.
U.S. Notice of Allowance dated Oct. 18, 2022 in U.S. Appl. No. 17/644,761.
U.S. Appl. No. 17/633,942, inventors Shaikh et al., filed on Aug. 6, 2020.
U.S. Appl. No. 18/002,289, inventors Linebarger et al., filed on Dec. 19, 2022.
U.S. Restriction requirement dated May 11, 2015 in U.S. Appl. No. 14/285,544.
International Preliminary Report on Patentability dated Jan. 5, 2023 in PCT Application No. PCT/US2021/038215.
International Search Report and Written Opinion dated Oct. 22, 2021, in PCT Application No. PCT/US2021/038215.
KR Office Action dated Aug. 22, 2022 in Application No. KR10-2022-0088448 with English translation.
KR Office Action dated Dec. 23, 2022 in Application No. KR10-2022-0088448 with English translation.
KR Office Action dated Jun. 19, 2023, in application No. KR10-2022-0088448 with English translation.
KR Search Report dated Jul. 27, 2022 in Application No. KR10-2022-0088448 with English translation.
U.S. Non-Final Office Action dated May 24, 2023 in U.S. Appl. No. 17/080,749.
U.S. Notice of Allowance dated Apr. 25, 2023 in U.S. Appl. No. 17/644,761.
U.S. Notice of Allowance dated May 3, 2023 in U.S. Appl. No. 17/644,761.
KR Notice of Preliminary Examination Report dated Jun. 12, 2023, in Application No. KR10- 2023-7013677.
KR Search Report dated May 10, 2023, in Application No. KR10-2023-7013677.
KR Office Action dated Oct. 27, 2022 in Application No. KR10-2022-7020424 With English Translation.
KR Office Action dated Aug. 18, 2023, in application No. KR 10-2023-7013677 with English translation.
U.S. Notice of Allowance dated Jul. 14, 2023 in U.S. Appl. No. 17/644,761.
International Search Report and Written Opinion dated Aug. 30, 2023, in Application No. PCT/US2023/021934.
International Search Report and Written Opinion dated Sep. 20, 2023 in PCT Application No. PCT/US2023/021927.
U.S. Notice of Allowance dated Oct. 30, 2023, in U.S. Appl. No. 17/633,942.
KR Search Report dated Oct. 13, 2023, in Application No. KR 10-2023-7022595.

\* cited by examiner

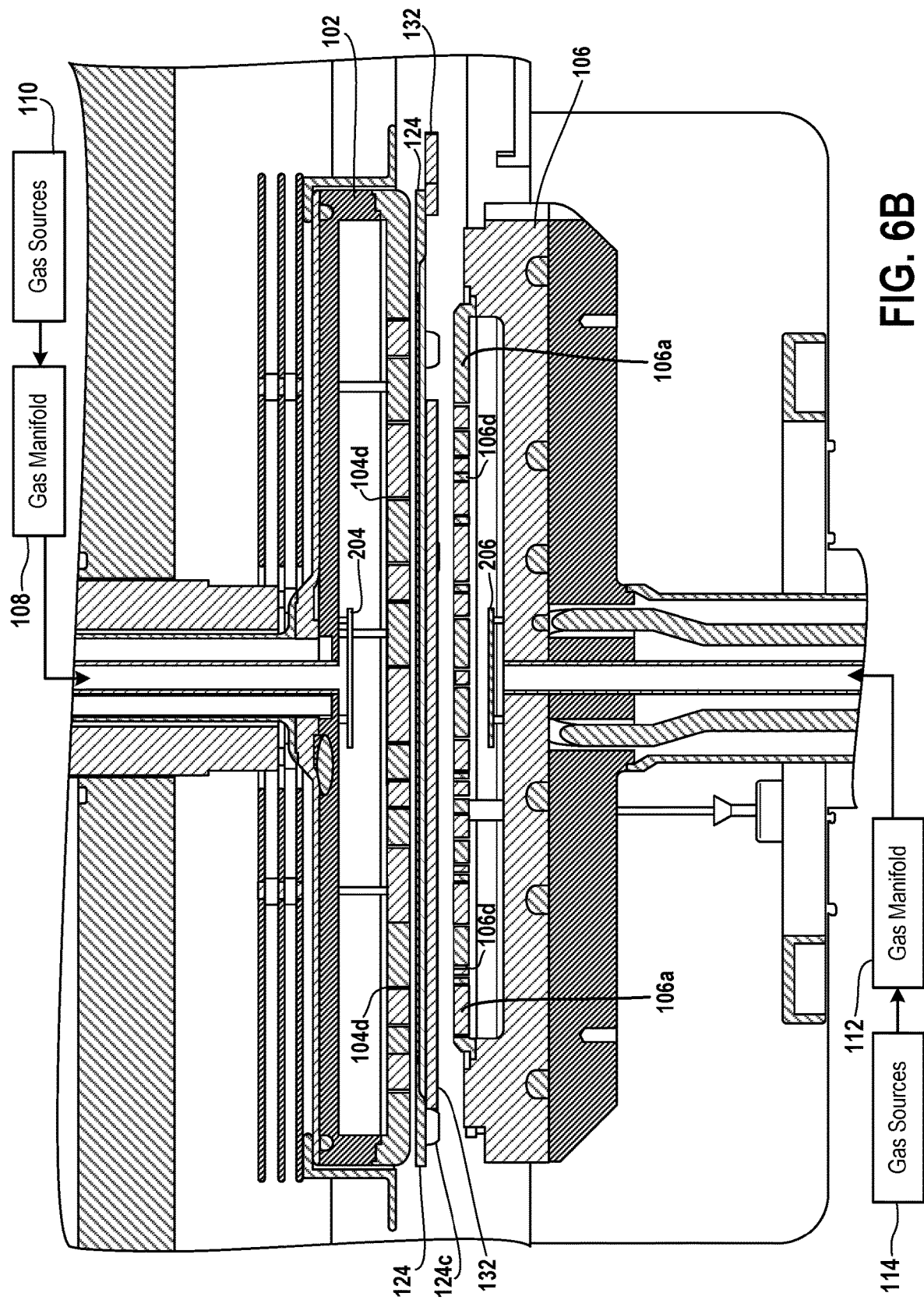

PECVD DEPOSITION SYSTEM FOR DEPOSITION ON SELECTIVE SIDE OF THE SUBSTRATE

RELATED APPLICATIONS

An Application Data Sheet is filed concurrently with this specification as part of the present application. Each application that the present application claims benefit of or priority to as identified in the concurrently filed Application Data Sheet is incorporated by reference herein in its entirety and for all purposes.

FIELD

The present embodiments relate to semiconductor wafer processing equipment tools, and more particularly, to chambers having pedestal configurations to enable back-side deposition to counteract wafer bowing as more layers on a top-side are formed.

BACKGROUND

Plasma-enhanced chemical vapor deposition (PECVD) is a type of plasma deposition that is used to deposit thin films from a gas state (i.e., vapor) to a solid state on a substrate such as a wafer. PECVD systems convert a liquid precursor into a vapor precursor, which is delivered to a chamber. PECVD systems may include a vaporizer that vaporizes the liquid precursor in a controlled manner to generate the vapor precursor. Typically, chambers used for PECVD use ceramic pedestals for supporting the wafer during processing, which enables processing under high temperatures.

Typically, most deposition and other processing to form the devices occur on the front face of a wafer, e.g., top-side. As the deposited layers build up, they can introduce stress in the wafer. This stress can cause the wafer to bow, which is undesirable. Where bowing is significant, it can deleteriously affect subsequent processing steps.

Sometimes, depositing materials on the back-side of the wafer may counteract wafer bowing and stress. However, to deposit on a back-side of the wafer, the wafer has to be flipped and loaded as back-side up. Flipping the wafer introduces additional problems, such as additional handling, potential exposure to particles, and/or reduction in processing yield.

It is in this context that inventions arise.

SUMMARY

Embodiments of the disclosure provide implementations for backside substrate deposition to counteract wafer warping, during to topside layer deposition. The systems and method disclosed herein include a shower-pedestal that is placed opposite a showerhead in a plasma processing chamber. The shower-pedestal is configured to supply process gases from a plurality of holes, which enable delivery of process gases for deposition of materials onto the backside of the substrate. The substrate, in one embodiment, is configured to be held by a carrier ring that is spaced apart from the shower-pedestal, such that the backside of the substrate is exposed to the deposition gases. The showerhead, in one embodiment, is configured to supply purge gases, e.g., inert gases, to prevent the backside deposition gases from forming materials layers on the topside of the substrate.

In one embodiment, a plasma processing system is disclosed. The system includes a chamber, a controller and a showerhead disposed in the chamber. A first gas manifold is connected to the showerhead for providing a first gas from a first gas source responsive to control from the controller. A shower-pedestal is disposed in the chamber and oriented opposite the showerhead. A second gas manifold is connected to the shower-pedestal for providing a second gas from a second gas source responsive to control from the controller. A substrate support for holding a substrate at a spaced apart relationship from the shower-pedestal is provided. A radio frequency (RF) power supply for providing power to the showerhead to generate a plasma is provided. The plasma is used for depositing a film on a back-side of the substrate, when present in the chamber. The substrate is held by the substrate support in the spaced apart relationship from the shower-pedestal, during backside deposition. The showerhead provides a purge gas during the backside deposition.

In another embodiment, a method for processing a substrate in a plasma processing system having a showerhead and a shower-pedestal oriented below the showerhead is provided. The method includes providing a carrier ring between the showerhead and the shower-pedestal. The carrier ring is configured to support the substrate. Then, flowing a process gas out of the shower-pedestal in a direction that is toward a backside of the substrate. The system will apply power to an electrode of the plasma processing system. The power is configured to produce a plasma in a region between a top surface of the shower-pedestal and the backside of the substrate. The plasma is configured to produce a material layer from the process gas that is deposited onto the backside of the substrate. The method further includes flowing an inert gas out of the showerhead in a direction that is toward a topside of the substrate. The flowing of the inert gas is configured to proceed while the flowing of the process gas. The process gas is purged from the topside of the substrate using the inert gas to prevent deposition on said topside while the material layer is deposited onto the backside of the substrate.

BRIEF DESCRIPTION OF THE DRAWINGS

FIGS. 6A and 6B illustrates chamber views showing spider forks utilized to support the carrier ring at a separation distance, while performing backside deposition onto the substrate, in accordance with one embodiment.

DESCRIPTION

Figure 1A:
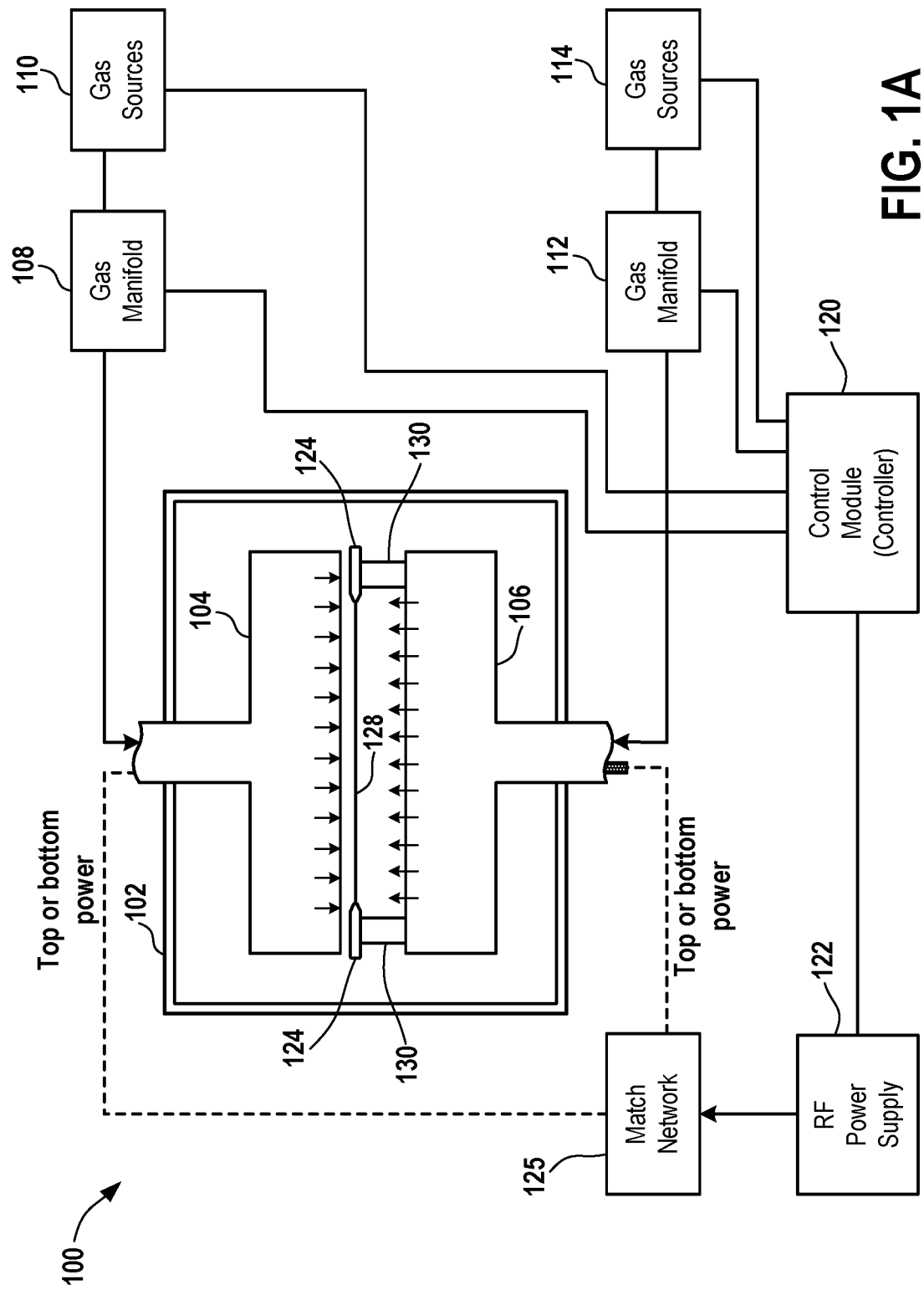
FIGS. 1A and 1B illustrate substrate processing systems, which can be configured for back-side wafer deposition, in accordance with some embodiments.

Embodiments of the disclosure provide embodiments of a process chamber, used for processing semiconductor wafers. In one implementation, a chamber is configured with a pedestal configuration that enables back-side deposition to counteract wafer bowing and/or stresses as more layers are formed on the top-side of the substrate.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 or 300 mm, though the industry is moving toward adoption of 450 mm diameter substrates. The description herein uses the terms "front" and "back" to describe the different sides of a wafer substrate. It is understood that the front side is where most deposition and processing occurs, and where the semiconductor devices themselves are fabricated. The back side is the opposite side of the wafer, which typically experiences minimal or no processing during fabrication.

The flow rates and power levels provided herein are appropriate for processing on 300 mm substrate, unless otherwise specified. One of ordinary skill in the art would appreciate that these flows and power levels may be adjusted as necessary for substrates of other sizes. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

The multi-level semiconductor processing flow to manufacture advanced memory and logic chips has caused substrates to warp significantly in compressive and tensile directions. Due to this moderate to severe substrate warpages, processing conditions of various manufacturing processes are compromised causing process control issues, lithography chucking and overlay issues, which sometimes cause increases in yield loss. In one embodiment, one way to control the warpage is to deposit a sacrificial film or multiple films on the opposite side (i.e., back-side) of the substrate to compensate the warpage in opposite direction resulting in flattening of the substrate. The traditional dual electrode RF PECVD systems have one gas-flowing electrode that can be RF or ground. Typically, the gas flowing electrode (also referred to as showerhead 104) is on the top side of the PECVD reactor causing the reactants to flow on the front-side of the wafer causing deposition only on the front-side of the wafer.

In accordance with one embodiment, an RF PECVD system is disclosed that has dual gas-flowing electrodes. Either one of the electrodes can be an RF electrode to provide AC fields enabling plasma enhancements for CVD film depositions. This dual gas-flowing electrode PECVD system is capable of selectively depositing films on both or only one side of the wafer. In one example, a gas-flowing pedestal (referred to herein as a "shower-pedestal" or "show-ped") can hold the wafer for transfers within the chamber between adjacent stations or outside the chamber via standard transfer mechanisms based on the equipment setup, yet be able to flow gases from the back-side of the wafer.

In one embodiment, the back-side gas flow enables the PECVD deposition on the back-side of the wafer while the front-side gas flow can deposit on the front side of the wafer. The system can be setup to selectively enable the side of the deposition by turning on and off the reactants that cause the film deposition and replacing them with non-reacting gases (e.g., inert gases). Another aspect of this system is to be able to control the distance of side of the substrate from the reactant flowing gases. This control enables achieving the deposition profile and film properties that are needed for the applications such as back-side compensation.

In another embodiment, the show-ped and showerhead include configurations that provide showerhead-like features that enable proper reactant mixing and providing appropriate flow dynamics for PECVD deposition processes on the back-side of the wafer, or front side. Additionally, some embodiments enable for a controllable gap that can suppress or allow the plasma on the desired (one or both) sides of the wafer for deposition. The gaps being controlled can include, e.g., a gap spacing between a top side of the wafer and the top surface of the show head 104, and a gap spacing between a back side of the wafer and the top surface of the show-ped 106. For example, while the back side of the wafer is being deposited, the gap between the top side of the wafer and the top surface of the showerhead is minimized. By way of example, this separation is between about 2 mm and about 0.5 mm and in another embodiment, between about 1 mm and about 0.5 mm (depending on wafer bow limits).

The show-ped 106 is further configured to include a showerhead hole pattern and inner plenums for even distribution of gases (i.e., to allow for process gases to be delivered toward the bottom of the wafer). The embodiments also allow for the gas-flowing pedestal (i.e., show-ped) to have an active heater to get the process gas to the proper temperature. The combination of the show-ped 106 and showerhead 104 allows for the concurrent function of both of key attributes. The show-ped 106 can, in one embodiment, still heat the wafer and provide the wafer transfer features within the reactor chamber or outside the reactor, while the showerhead 104 components allows for process gas flow. The gas-flowing pedestal (i.e., show-ped) disclosed herein therefore enable implementation of traditional PECVD processes to deposit on either side of the wafer, selectively. These configurations are also configured to selectively RF power the top or bottom electrode, and dynamically enable/disable the plasma on the side of the wafer that needs deposition.

Broadly speaking, the show-ped provides several advantages for combating the stress and bowing issues by depositing a film on the back side of the wafer. The back side film counteracts the stress from the front side deposition to result in a neutral stress (or substantially neutral stress, e.g., less than about +/−150 MPa) wafer that shows no bowing (or substantially no bowing, e.g., less than about 150 μm of bow). If the film deposited on the front side is tensile, then the back side film should also be tensile to balance out the overall stress. Likewise, if the front side film is compressive, then the back side film should also be compressive. The back side film may be deposited through various reaction mechanisms (e.g., chemical vapor deposition (CVD), plasma enhanced chemical vapor deposition (PECVD), atomic layer deposition (ALD), plasma enhanced atomic layer deposition (PEALD), low pressure chemical vapor deposition (LPCVD), etc). In various cases, plasma enhanced chemical vapor deposition is used due to the high deposition rate achieved in this type of reaction.

Certain deposition parameters can be tuned to produce a back side film having a desired stress level. One of these deposition parameters is the thickness of the deposited back side film. Thicker films induce more stress in the wafer, while thinner films (of the same composition and deposited under the same conditions) induce less stress in the wafer. Therefore, in order to minimize the amount of material consumed in forming the back side layer, this layer may be deposited relatively thinly under conditions that promote formation of a highly stressed film.

As mentioned, stacks of deposited materials are especially likely to result in wafer stress and bowing. One example stack that may cause these problems is a stack having alternating layers of oxide and nitride (e.g., silicon oxide/silicon nitride/silicon oxide/silicon nitride, etc.). Another example stack likely to result in bowing includes alternating layers of oxide and polysilicon (e.g., silicon oxide/polysilicon/silicon oxide/polysilicon, etc.). Other examples of stack materials that may be problematic include, but are not limited to, tungsten and titanium nitride. The materials in the stacks may be deposited through chemical vapor deposition techniques such as plasma enhanced chemical vapor deposition (PECVD), low pressure chemical vapor deposition (LPCVD), metal organic chemical vapor deposition (MOCVD), atomic layer deposition (ALD), plasma enhanced atomic layer deposition (PEALD), or through direct metal deposition (DMD), etc. These examples are not intended to be limiting. Certain disclosed embodiments may be useful whenever wafer stress and/or bowing are induced due to material present on the front side of the wafer.

The front side stacks may be deposited to any number of layers and thicknesses. In a typical example, the stack includes between about 32-72 layers, and has a total thickness between about 2-4 μm. The stress induced in the wafer by the stack may be between about −500 MPa to about +500 MPa, resulting in a bow that is frequently between about 200-400 μm (for a 300 mm wafer), and even greater in some cases.

The material deposited on the back side of the wafer may be a dielectric material in various embodiments. In some cases, an oxide and/or nitride (e.g., silicon oxide/silicon nitride) is used. Examples of silicon-containing reactants that may be used include, but are not limited to, silanes, halosilanes, and aminosilanes. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$). Other potential silicon-containing reactants include tetraethyl orthosilicate (TEOS), and cyclic and non-cyclic TEOS variants such as tetramethoxysilane (TMOS), fluorotriethoxysilane (FTES), Trimethylsilane (TMS), octamethyltetracyclosiloxane (OMCTS), tetramethylcyclotetrasiloxane (TMCTSO), dimethyldimethoxysilane (DMDS), hexamethyldisilazane (HMDS), hexamethyldisiloxane (HMDSO), hexamethylcyclotrisiloxane (HMCTSO), dimethyldiethoxysilane (DMDEOS), methyltrimethoxysilane (MTMOS), tetramethyldisiloxane (TMDSO), divinyltetramethyldisiloxane (VSI2), methyltriethoxysilane (MTEOS), dimethyltetramethoxydisiloxane (DMTMODSO), ethyltriethoxysilane (ETEOS), ethyltrimethoxysilane (ETMOS), hexamethoxydisilane (H MODS), bis(triehtoxysilyl)ethane (BTEOSE), bis(trimethoxysilyl)ethane (BTMOSE), dimethylethoxysilane (DMEOS), tetraethoxydimethyldisiloxane (TEODMDSO), tetrakis(trimehtylsiloxy)silane (TTMSOS), tetramethyldiethoxydisiloxane (TMDEODSO), triethoxysilane (TIEOS), trimethoxysilane (TIMEOS), or tetrapropoxysilane (TPOS).

Example nitrogen-containing reactants include, but are not limited to, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

Examples of oxygen-containing co-reactants include oxygen, ozone, nitrous oxide, carbon monoxide, nitric oxide, nitrogen dioxide, sulfur oxide, sulfur dioxide, oxygen-containing hydrocarbons ($CxHyOz$), water, mixtures thereof, etc.

The flow rate of these reactants will depend greatly on the type of reaction through which the back side layer is deposited. Where CVD/PECVD are used to deposit the back side layer, the flow rate of the silicon-containing reactant may be between about 0.5-10 mL/min (before atomization), for example between about 0.5-5 mL/min. The flow rate of a nitrogen-containing reactant, oxygen-containing reactant, or other co-reactant may be between about 3-25 SLM, for example between about 3-10 SLM.

In certain implementations the back side layer may be removed after further processing. Where this is the case, the composition of the back side layer should be chosen such that it can be easily removed from the substrate at an appropriate time. In this regard, there should be a high selectivity between the material of the back side layer (e.g., the dielectric) and the material of the underlying substrate (e.g., silicon) in the desired removal chemistry.

The optimal thickness of the back side layer will depend on the amount of stress induced by the deposition on the front side of the wafer, as well as the conditions under which the back side layer is deposited. The back side layer may be deposited to a thickness at which the stress in the wafer becomes negligible (e.g., less than about 150 MPa). In these or other embodiments, the back side layer may be deposited to a thickness at which the wafer bow becomes negligible (e.g., less than about 150 µm of bow). In some cases, this corresponds to a back side layer thickness between about 0.1-2 µm, for example between about 0.3-2 µm, or between about 0.1-1 µm, or between about 0.3-1 µm. Where silicon nitride is used to form the back side layer, a film having a thickness of about 0.3 µm is sufficient to mitigate a bow of about 50-200 µm. As mentioned above, a higher stress back side layer may be used to reduce the required thickness of the layer. This helps conserve materials and reduce costs. For more information regarding backside deposition techniques, reference may be made to U.S. patent application Ser. No. 14/285,554, which is owned by the same assignee as the present application, and is herein incorporated by reference.

It should be appreciated that the present embodiments can be implemented in numerous ways, such as a process, an apparatus, a system, a device, or a method. Several embodiments are described below.

Deposition of films is in one embodiment implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations.

While in process, each wafer is held in place by a pedestal, wafer chuck and/or other wafer holding apparatus. For certain operations, the apparatus may include a heater such as a heating plate to heat the wafer.

FIG. 1A illustrates a substrate processing system 100, which is used to process a wafer 128. The system includes a chamber 102. A center column is configured to support a pedestal for when a top surface of the substrate 128 is being processed, e.g., a film is being formed on the top surface. The pedestal, in accordance with embodiments disclosed herein, is referred to as a showerhead-pedestal ("show-ped") 106. A showerhead 104 is disposed over the show-ped 106. In one embodiment, the showerhead 104 is electrically coupled to power supply 122 via a match network 125. The power supply 122 is controlled by a control module 120, e.g., a controller. In other embodiments, it is possible to provide power to the show-ped 106 instead of the showerhead 104. The control module 120 is configured to operate the substrate processing system 100 by executing process input and control for specific recipes. Depending on whether the top surface of the substrate 128 is receiving a deposited film or the bottom surface of the substrate 128 is receiving a deposited film, the controller module 120 sets various operational inputs, for a process recipe, e.g., such as power levels, timing parameters, process gasses, mechanical movement of the wafer 128, height of the wafer 128 off of the show-ped 106, etc.

The center column can also include lift pins, which are controlled by a lift pin control. The lift pins are used to raise the wafer 128 from the show-ped 106 to allow an end-effector to pick the wafer and to lower the wafer 128 after being placed by the end end-effector. The end effector (not shown), can also place the wafer 128 over spacers 130. As will be described below, the spacers 130 are sized to provide a controlled separation of the wafer 128 between a top surface of the showerhead 104 (facing the wafer) and a top surface of the show-ped 106 (facing the wafer).

The substrate processing system 100 further includes a gas manifold 108 that is connected to gas sources 110, e.g., gas chemistry supplies from a facility and/or inert gases. Depending on the processing being performed over a top surface of the substrate, the control module 120 controls the delivery of gas sources 110 via the gas manifold 108. The chosen gases are then flowed into the showerhead 104 and distributed in a space volume defined between a face of the showerhead 104 that faces that wafer 128 when the wafer is resting over the pedestal 140.

The substrate processing system 100 further includes a gas manifold 112 that is connected to gas sources 114, e.g., gas chemistry supplies from a facility and/or inert gases. Depending on the processing being performed over a bottom surface of the substrate, the control module 120 controls the delivery of gas sources 114 via the gas manifold 112. The chosen gases are then flowed into the showerhead 104 and distributed in a space volume defined between a face of the show-ped 106 that faces an under surface/side of the wafer 128 when the wafer is resting over on the spacers 130. The spacers 130 provide for a separation that optimizes deposition to the under surface of the wafer 128, while reducing deposition over the top surface of the wafer. In one embodiment, while deposition is targeted for the under surface of the wafer 128, an inert gas is flown over the top surface of the wafer 128 via the showerhead 104, which pushes reactant gas away from the top surface and enables reactant gases provided from the show-ped 106 to be directed to the under surface of the wafer 128.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 124 that encircles an outer region of the show-ped 106. When the top surface of the wafer 128 is being processed, e.g., a material is being deposited thereon, the carrier ring 124 is configured to sit over a carrier ring support region that is a step down from a wafer support region in the center of the pedestal show-ped 106. The carrier ring 124 includes an outer edge side of its disk structure, e.g., outer radius, and a wafer edge side of its disk structure, e.g., inner radius, that is closest to where the wafer 128 sits. The wafer edge side of the carrier ring 124 includes a plurality of contact support structures which are configured to lift the wafer 128 when the carrier ring 124 is held by the spacers 130.

Figure 1B:
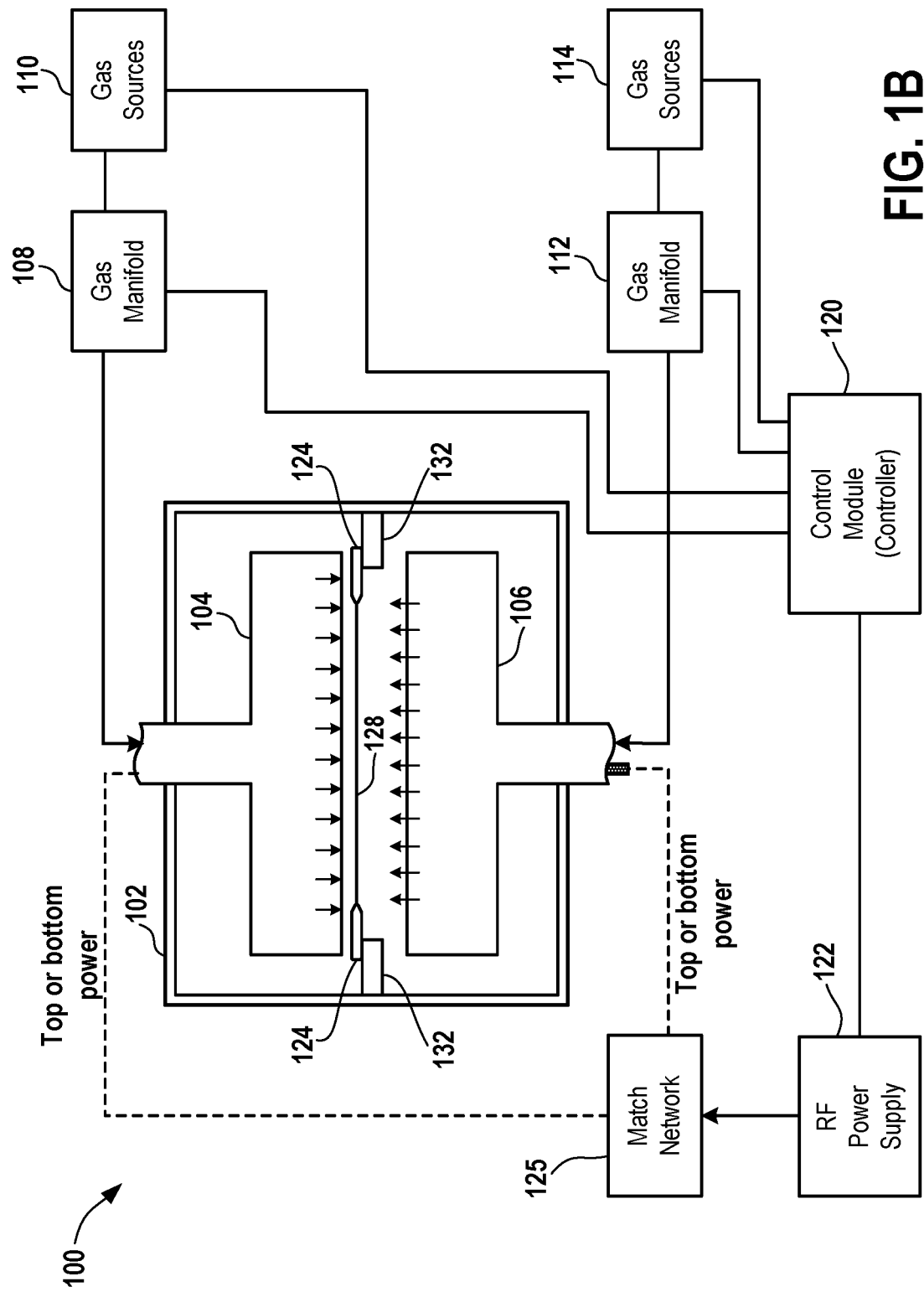

In FIG. 1B, spider forks 132 are used to lift and maintain the carrier ring 124 in its process height (i.e., for depositing in the under surface of the wafer 128). The carrier ring 124 is therefore lifted along with the wafer 128 and can be rotated to another station, e.g., in a multi-station system.

Figure 3:
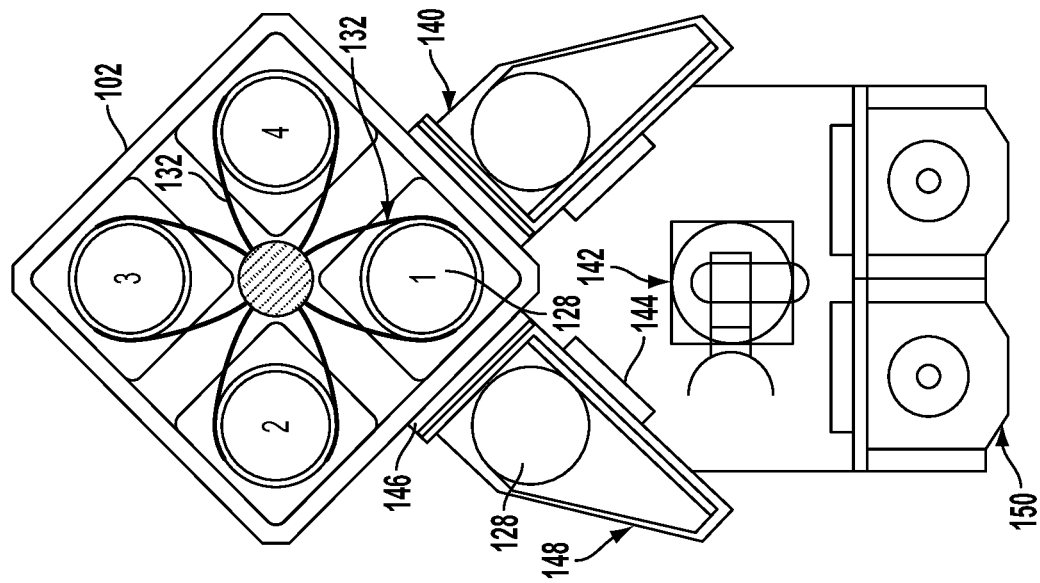
FIG. 3 shows a schematic view of an embodiment of a multi-station processing tool with an inbound load lock and an outbound load lock, in accordance with one embodiment.
Figure 2:
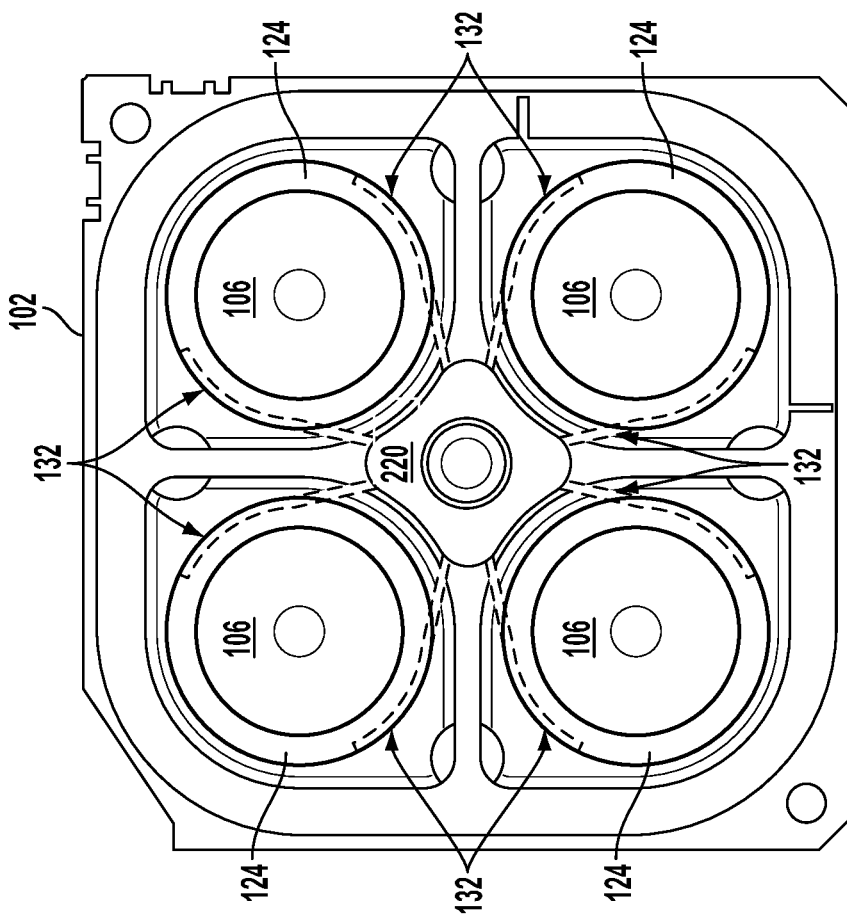
FIG. 2 illustrates a top view of a multi-station processing tool, wherein four processing stations are provided, in accordance with one embodiment.

FIG. 2 illustrates a top view of a multi-station processing tool, wherein four processing stations are provided. The embodiment of FIGS. 1A and 1B illustrate a chamber 102, which can be implemented in chamber 102 of FIGS. 2 and 3, which have four chamber stations. FIGS. 2 and 3 provide top views of a chamber portion (e.g., with a top chamber portion removed for illustration), wherein four stations are accessed by spider forks 132. Each spider fork 132, or fork includes a first and second arm, each of which is positioned around a portion of each side of the show-ped 106. In this view, the spider forks 132 are drawn in dash-lines, to convey that they are below the carrier ring 124. The spider forks 132, using an engagement and rotation mechanism 220 are configured to raise up and lift the carrier rings 124 (i.e., from a lower surface of the carrier rings 124) from the stations simultaneously, and then rotate at least one or more stations before lowering the carrier rings 124 (where at least one of the carrier rings supports a wafer 128) to a next location so that further plasma processing, treatment and/or film deposition can take place on respective wafers 128. As noted above, in one embodiment, the spider forks 132 can be used to raise the wafer 128 to a height that enables deposition on a backside of the wafer 128, while substantially preventing deposition on a topside of the wafer 128, e.g., as shown in FIG. 1B.

FIG. 3 shows a schematic view of an embodiment of a multi-station processing tool with an inbound load lock 148 and an outbound load lock 140. A robot 142, at atmospheric pressure, is configured to move substrates 128 from a cassette loaded through a pod 150 into inbound load lock 148 via an atmospheric port 144. Inbound load lock 148 is coupled to a vacuum source (not shown) so that, when atmospheric port 144 is closed, inbound load lock 148 may be pumped down. Inbound load lock 148 also includes a chamber transport port 146 interfaced with processing chamber 102. Thus, when chamber transport 146 is opened, another robot (not shown) may move the substrate from inbound load lock 148 to a show-ped 106 of a first process station for processing.

The depicted processing chamber 102 comprises four process stations, numbered from 1 to 4 in the embodiment shown in FIG. 3. In some embodiments, processing chamber 102 may be configured to maintain a low pressure environment so that substrates may be transferred using a carrier ring 124 among the process stations without experiencing a vacuum break and/or air exposure. Each process station depicted in FIG. 3 a show-ped 106 that is configured to deliver a process gas when backside deposition is to occur. During backside deposition, whether spacers or spider forks are used to raise the wafer off of the show-ped 106, the showerhead 104 is configured to supply an inert gas over the top surface of the substrate to prevent or reduce deposition over the top surface of the wafer 106.

FIG. 3 also depicts spider forks 132 for transferring wafers within processing chamber 102 and lifting the wafer 128 during backside deposition. As will be described in more detail below, the spider forks 132 can also rotate and enable transfer of wafers from one station to another. The transfer occurs by enabling the spider forks 132 to lift carrier rings 124 from an outer undersurface, which then lifts the wafer, and then rotates the wafer and carrier 124 together to the next station. In one configuration, the spider forks 132 are made from a ceramic material to withstand high levels of heat during processing.

In other embodiments, instead of using spider forks 132 to lift and transfer the wafers, a paddle type structure can also function to lift and transfer the wafers. Paddles can be disposed between the stations, similar to the way the spider forms 132 sit, and can function in the same way. Thus, for easy of understanding, references to spider forms 132 should be understood to also apply to paddle configurations, which can provide the control lifting (e.g., during backside wafer deposition) and transfers between stations.

Broadly speaking, the embodiments disclosed herein are for a system to deposit PECVD films on the selective side of the wafer (front and/or back) with dynamic control. One embodiment includes a dual gas-flowing electrode for defining a capacitively-coupled PECVD system. The system will include a gas-flowing showerhead 104 and a show-ped 106. In one embodiment, the gas-flowing pedestal (i.e., show-ped) is a combination showerhead and pedestal, which enables deposition on a back-side of the wafer. The electrode geometry combines features of a showerhead, e.g., such as a gas mixing plenum, holes, hole-pattern, gas jet preventing baffle, and features of a pedestal, e.g., such as embedded controlled heater, wafer-lift mechanisms, ability to hold plasma suppression rings, and movability. This enables the transfer of wafers and the processing of gasses with or without RF power from the pedestal.

In one embodiment, the system has a wafer lift mechanism that allows tight control of parallelism of the substrates against the electrodes. In one embodiment, this is achieved by setting up the lift mechanism parallel to the two electrodes and controlling manufacturing tolerances, e.g., spindle or lift pins mechanisms. Another embodiment is defined by raising the wafer lift parts, but this option does not allow dynamic control of the side that gets deposited.

In one configuration, the lift mechanism allows controlling of the distance dynamically during the process (before plasma, during plasma, after plasma) to control the side of the deposition, profile of the deposition, and deposition film properties. The system further allows selective enabling/disabling of the side where reactants are flown. One side can flow the reactant and the other side can flow inert gases to suppress the deposition and plasma.

In one embodiment, the gap between the side of the wafer that does not need plasma/dep has to be tightly controlled to a minimum value that is required to suppress plasma (otherwise there will be a plasma damage). In one example, this system allows minimal gap from about 2 mm to about 0.5 mm, and in another embodiment from about 1 mm to about 0.05 (limited by the wafer bow), and such gap can be controlled. In one embodiment, this gap depends upon the process conditions.

In one embodiment, the gas-flowing pedestal (i.e., show-ped) enables, without limitation: (a) thermal stabilization of the wafer to processing temperature prior to processing; (b) selective design of hole patterns on the show-ped to selectively deposition film in different areas of the back-side of the wafer; (c) swappable rings can be attached to achieve appropriate plasma confinement and hole pattern; (d) stable wafer transfer mechanisms within chamber and for transferring wafer outside to another chamber or cassette—such as lift pins, RF-coupling features, minimum-contact arrays; (e) implement gas mixing features, e.g., such as inner plenum, baffle and manifold lines openings; and (f) add compartments in the gas-flowing pedestal (i.e., show-ped) to enable selective gas flow to different regions of the back side of the wafer and control flow rates via flow controllers and/or multiple plenums.

In another embodiment, dynamic gap control using wafer lift mechanism enables: (a) control of the distance from deposition or reactant flowing electrode to the side of the wafer that needs deposition or in the middle so that both sides can be deposited; and (b) the lift mechanism to control the distance dynamically during the process (before plasma, during plasma, after plasma) to control the side of the deposition, profile of the deposition, and deposition film properties. In another embodiment, for a deposition mode used to deposit on the back-side of the wafer, film edge exclusion control is highly desirable to avoid lithography-related overlay problems. The lift mechanism used in this system is done via a carrier ring 124 that has a design feature to shadow the deposition on the edge. This specifies the edge exclusion control via the design and shape of the carrier ring.

Figure 4A:
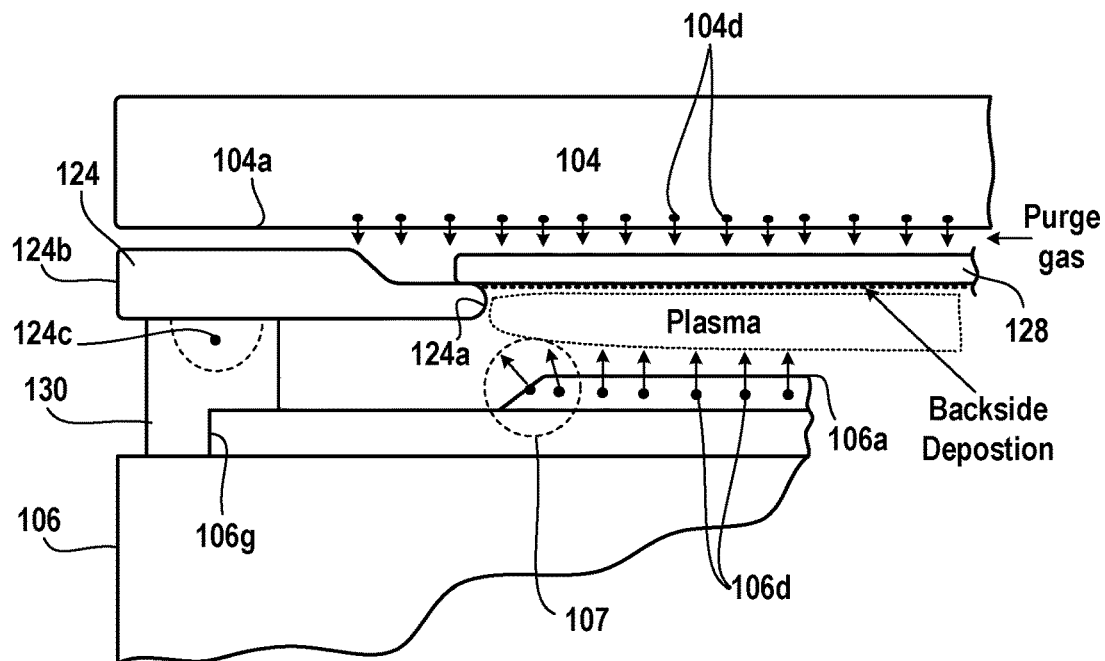
FIG. 4A provides a cross-sectional view of an edge of the shower-pedestal, when the substrate 128 is raised a separation distance from the top surface of the shower-pedestal.
Figure 4B:
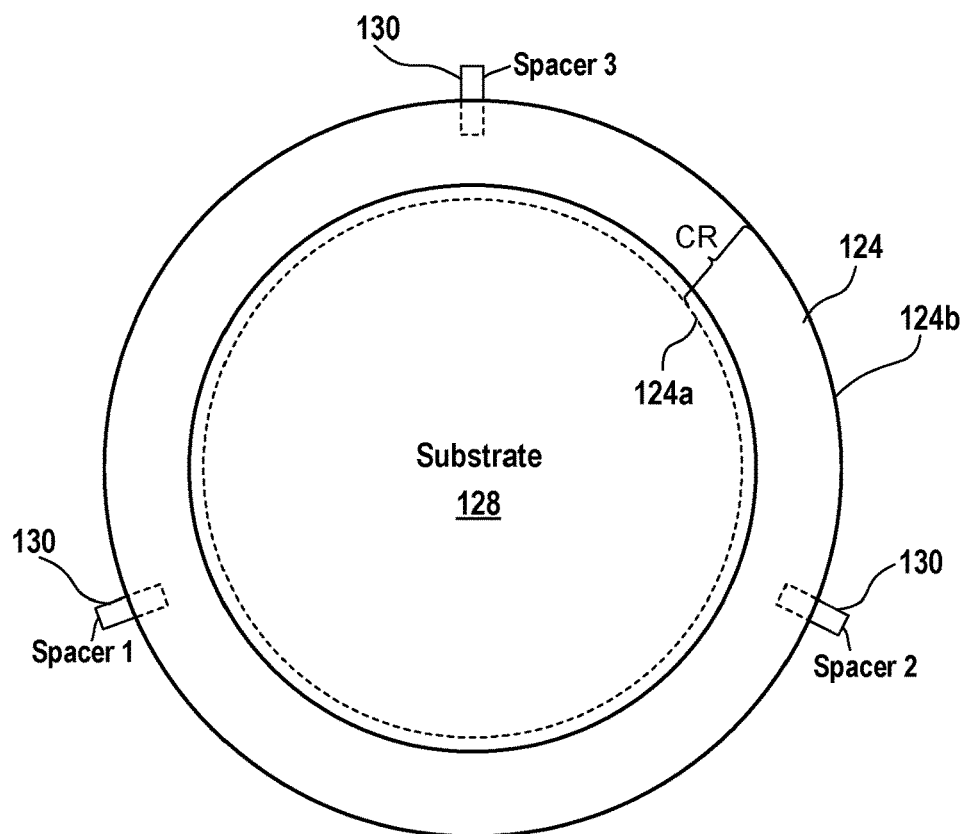
FIG. 4B illustrates a top view of the spacers utilized to support the carrier ring, in the separation distance, during backside deposition of the substrate, in accordance with one embodiment.

FIG. 4A shows a cross-sectional view of an edge region of the show-ped 106. This view provides a cross-sectional representation of the carrier ring 124, which has a carrier ring inner radius 124a and a carrier ring outer radius 124b. The spacer 130 is configured to sit over the show-ped 106 at an edge defined by a step region 106g in the show-ped 106. As shown in FIG. 4B, the spacers 130 are preferably spaced apart to provide even support for the carrier ring 124 from a lower surface of the carrier ring 124. In one embodiment, the carrier ring 124 will include support extensions 124c, which extend below the substantial flat surface of the carrier ring 124.

In some embodiments, where the overlap of the wafer edge to the carrier inner radius is reduced, a notch of the substrate may be exposed. To avoid having a gap covering the notch, the carrier ring may be constructed to have an extension in a region where the notch is to be placed. In this manner, it is possible to extend the area where backside deposition is to occur, while avoiding deposition non-uniformities due to exposed wafer notches. As such, various sizes of edge exclusions (EE) can be handled by adjusting the geometry of the carrier ring 124.

The support extensions 124c are configured to mate and sit within support surfaces defined into a top surface of the spacers 130. The support surfaces provide a complementary mating surface for the support extensions 124c, such that the carrier ring 124 is prevented from sliding or moving when supported by the spacers 130. Although three spacers 130 are shown in FIG. 4B, it is envisioned that any number of spacers may be provided, so long as the carrier ring can be supported substantially parallel to the surface of the show-ped 106, and spacing is defined for supporting substrate 128 at a spaced apart relationship from a top surface of the show-ped 106.

Further shown is that a top surface of the show-ped 106 will include a hole pattern 106a that is distributed throughout the surface to provide even distribution and output of gases during operation. In one embodiment, the hole pattern 106a is distributed in a plurality of concentric rings that start at the center of the top surface of the show-ped 106 and extend to an outer periphery of the show-ped 106. At least one ring of holes 106a is provided at an edge hole region 107 of the hole pattern, and orifices defined in the edge hole region 107 are preferably angled to provide gases non-perpendicular to the surface of the show-ped 106.

In one example, the angle or tilt at which the orifices in the edge hole region 107 is defined to tilt or angle away from the center of the show-ped 106. In one embodiment, the angle is approximately 45° from horizontal. In other embodiments, the angle can vary between 20° from horizontal to about 80° from horizontal. In one embodiment, by providing the angled orifices in the edge hole region 107, additional distribution of process gases can be provided during backside deposition of the substrate 128. In one embodiment, the remainder orifices 106d of the hole pattern 106a are oriented substantially perpendicular to the surface of the show-ped 106, and directed toward the underside of the substrate 128.

FIG. 4B illustrates that when the substrate 128 is held by the carrier ring 124, the substrate 128 edge will sit on an edge region closer to the carrier ring inner radius 124a of the carrier ring 124. As will be shown in more detail in other figures, the surface of the showerhead 104 facing the top surface of the substrate 128, when positioned using spacers 130, will be substantially close to prevent deposition during a mode where deposition is being carried out to the backside of the substrate 128.

By way of example, the distance between the top of the substrate 128 and the surface of the showerhead 104 is preferably between about 2 mm and 0.5 mm, and in some embodiments between about 1 mm and about 0.5 mm, depending on the wafer bow. That is, if the wafer is bowed substantially, the separation will be greater than 0.5 mm. If the wafer is not yet bowed substantially, the separation can be less than 0.5 mm. In one embodiment, it is preferable that the separation be minimized to prevent deposition on the top side of the substrate when the backside of the substrate is being deposited with a layer of material. In one embodiment, the showerhead 104 is configured to supply an inert gas flow over the top side of the substrate 128 during when the backside of the substrate is being deposited and deposition gases are being supplied by the show-ped 106.

Figure 5A:
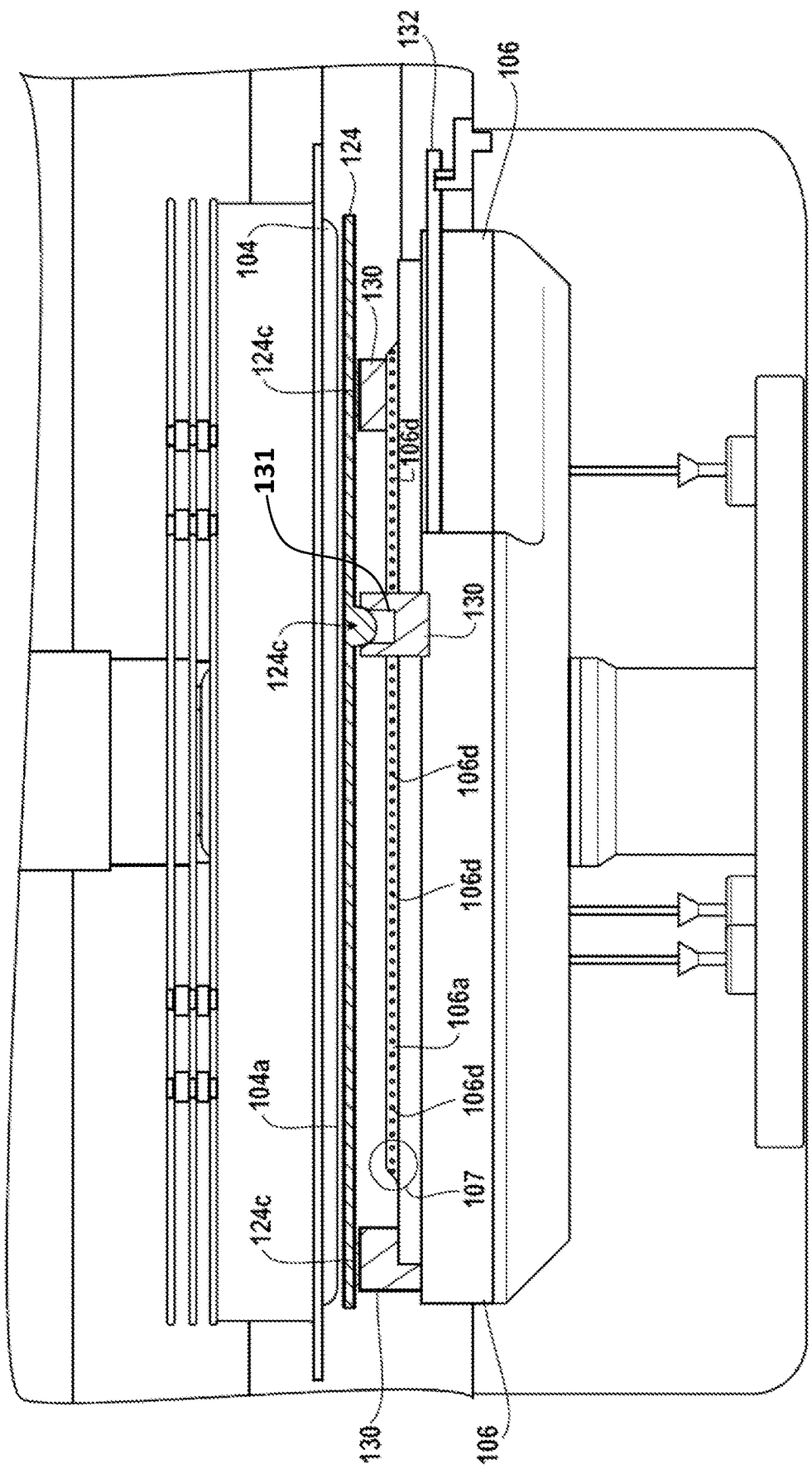
FIGS. 5A and 5B illustrate chamber views showing the spacers supporting the carrier ring at a separation distance, while performing backside deposition onto the substrate, in accordance with one embodiment.

FIG. 5A illustrates an example of a plasma processing system that includes the showerhead 104 positioned over the show-ped 106. In this example, the spacers 130 are shown supporting the carrier ring 124, and support extensions 124c are being held within recessed regions 131 of the spacers 130. As noted above, the spacers 130 are configured to hold the carrier ring 124 at a separation distance that elevates the carrier ring 124 and the wafer 128 being supported thereon away from the surface of the show-ped 106.

In this manner, the top surface of the wafer 128 is placed substantially close to the exposed surface 104a of the showerhead 104 at a reduced separation. As mentioned above, that reduced separation is preferably between about 2 mm and 0.5 mm, and in some embodiments between about 1 mm and about 0.5 mm, depending on the wafer bow. That is, if the wafer is bowed substantially, the separation will be greater than 0.5 mm. If the wafer is not yet bowed substantially, the separation can be less than 0.5 mm. Additionally, the showerhead 104 is configured to supply an inner gas that is flown over the top surface of the wafer being supported by carrier ring 124 during a mode when backside deposition is being processed by the supply of reactants and process gases by the show-ped 106.

Further shown are the plurality of orifices 106d which define a hole pattern 106a over the surface of the show-ped 106. The edge hole region 107 is also shown, indicating that the edge hole region can include at least one row of circumferentially arranged holes that are angled to provide process gases toward an outer edge of the show-ped 106, and so as to provide process gases closer to the edge of the underside of the substrate being supported by the carrier ring 124.

Figure 5B:
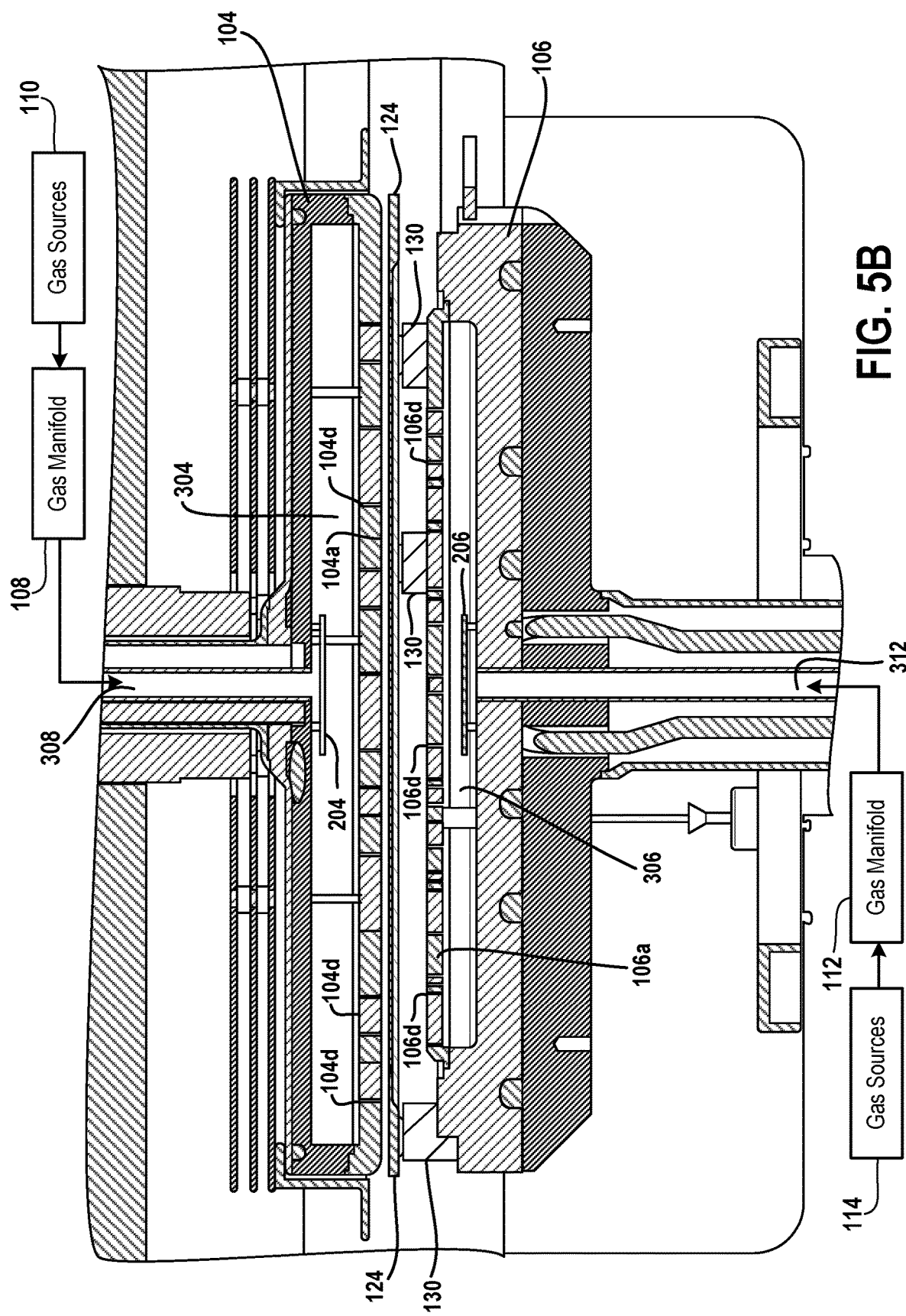

FIG. 5B illustrates a cross-sectional view of the plasma processing system of FIG. 5A. In this example, the orifices 106*d* of the show-ped 106 and the orifices 104*d* of the showerhead are shown providing a path out from plenum regions 306 and 304, respectively. The plenums 306 and 304 are provided to assist in distribution of gases introduced into the show-ped 106 and showerhead 104. A baffle 206 is disposed in the show-ped 106, which is positioned along a gas entry path 312 into the show-ped 106. The baffle 206 assists in distributing gases introduced into the plenum 306 of the show-ped 106. A baffle 204 is disposed in the showerhead 104, which is positioned along a gas entry path 308 into the shower head 104. The baffle 204 assists in distributing gases introduced into the plenum 304 of the showerhead 104.

Further shown is a gas manifold 112 coupled to the gas entry path 312 of the show-ped 106. Gas sources 114 are shown coupled to the gas manifold 112. Gas sources 114 are configured to provide one or more different types of gases to the show-ped 106. By way of example, the gases can be reacting gases used for deposition onto the backside of the substrate 128, when the carrier ring 124 is supported by the spacers 130. In one embodiment, a backside material layer can be deposited using the show-ped 106 by flowing a process case, e.g., a silane (SiH4)+ammonia (NH3), while the showerhead 104 delivers a flow of nitrogen (N2) purge gas.

Another example backside deposition process can be SiH4+N2O chemistries, which can be adjusted to impart a stress ranging from 0 MPa to −400 MPa, by changing flow rates of SIH4/N2O and powers. Further, it is believed that an SiN film with SiH4+NH3 chemistries can stresses from −1200 MPa to +1200 MPa. An SiO2 process with TEOS chemistry can provide stresses ranging +200 MPa to −400 Mpa. Thus, by selecting the chemistry, the location to apply the gas, and the thicknesses, it is possible to strategically counteract the stresses caused by front side deposition of layers and reduce or avoid wafer/substrate warping.

Further, as noted above, while the purge gas is delivered by the showerhead 104, the gap between the showerhead and the top surface of the substrate 128 is minimized, e.g., to be between about 0.5 mm and about 5 mm. If the wafer is bowed too much, then the separation can be larger than 0.5 mm, but preferably less than 5 mm, and in one embodiment, less than about 3 mm, or less than about 2 mm, or less than about 1 mm.

Flowing SiH4+NH3 (via the orifices 106*d* of show-ped 106), a layer of SiN/SiO$_2$ film is deposited on the backside of the substrate 128, while the substrate is held by the carrier ring 124 in the spaced apart relationship to the top surface of the show-ped 106. In the mode where top-side deposition is occurring in the same chamber, the show-ped 106 operates as a pedestal, without flowing gases out of the orifices 106*d*. In this configuration, different types of materials, depending on chosen recipe, can be deposited over the top surface of the substrate 128. Thus, backside deposition is enabled to address high stresses inducted, e.g., by nitrogen, oxide films. That is, the backside deposition compensates for the stresses induced during top side deposition and assists in reducing wafer bow.

A gas manifold 108 coupled to the gas entry path 308 is provided with connection to gas sources 110. The gas entry path 308 provides a channel for supplying gases into the shower head 104, which lead to the baffle 204 and the plenum 304. The gas sources 110 can provide different types of gases, depending on the processing being performed. By way of example, if backside deposition is occurring for substrate 128, the showerhead 104 is configured to deliver an inert gas that flows over the top surface of the substrate 128, so as to prevent deposition over the top surface of the substrate 128.

The showerhead 104 can be configured to supply gases at different rates so as to prevent deposition gases from seeping over the top surface when the back surface is being deposited. If top surface deposition is in process, the substrate 128 is lowered onto the surface of the show-ped 106, and the spacers 130 are removed. In this configuration, top surface deposition can proceed utilizing process gases introduced into the showerhead 104. During this phase, process gasses are not introduced by way of the show-ped 106, and the show-ped operates as a standard support chuck or pedestal. As such, it should be appreciated that the show-ped 106 can operate in multiple modes, depending on the surface being deposited, e.g., top surface or back surface of the substrate 128.

Figure 6A:
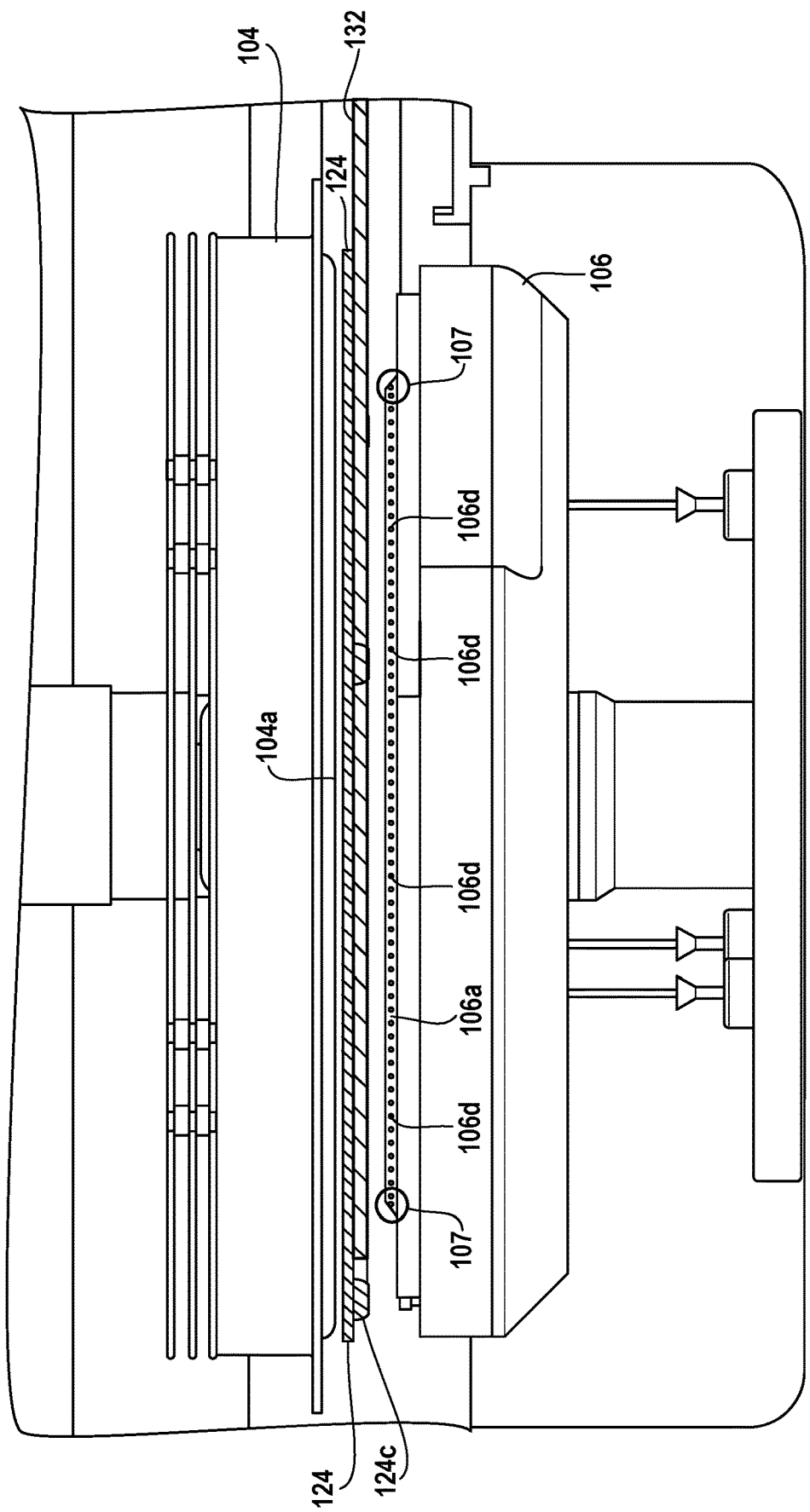

FIG. 6A illustrates another embodiment of a plasma processing system. In this embodiment, the spacers 130 are not utilized to raise the carrier ring 124 to the appropriate height above the surface of the show-ped 106. Instead, spider forks 132 are utilized to raise and maintain the carrier ring 124 at a controllable height, so that backside deposition of the wafer 128 being supported by the carrier ring 124 can occur by way of reacting gases introduced through the orifices 106*d* of the show-ped 106. As discussed above, the show-ped 106 will include a plurality of orifices 106*d* arranged in concentric circles that extend from the center to the edge of the show-ped 106.

An outer edge region 107, which can include one or more concentric circles of orifices can be arranged to provide angled output of the reacting gases that are directed toward the outer edges of the underside of the substrate 128, when held by the carrier ring 124. The spider forks 132 are shown by way of example in FIGS. 2 and 3. It should be understood that alternate methods for handling a carrier ring 124 can also be employed. For instance, paddle supports arranged between the stations can also be used to handle the carrier ring and raise the carrier ring to the appropriate height, to achieve a separation distance between a top surface of the show-ped 106 and the underside of the substrate 128. Broadly speaking, the spacers 130 and the spider forks 132 or paddles, provide a substrate support for holding the carrier ring 124 (and substrate when present) at a spaced apart relationship from the show-ped 106.

In one embodiment, the substrate support in accordance with FIGS. 1A, 4A-5B is for holding the substrate at a spaced apart relationship from the shower-pedestal is defined by a plurality of spacers 130. The spacers include at least three spacers having support surfaces for holding a carrier ring, and the carrier ring is configured to hold the substrate, when present, at the spaced apart relationship.

In accordance with FIGS. 1B, 6A and 6B, the substrate support for holding the substrate at a spaced apart relationship from the shower-pedestal is defined by one of spider forks or paddles, the spider forks or paddles are configured to hold a carrier ring, the carrier ring being configured to hold the substrate, when present, at the spaced apart relationship.

Figure 7A:
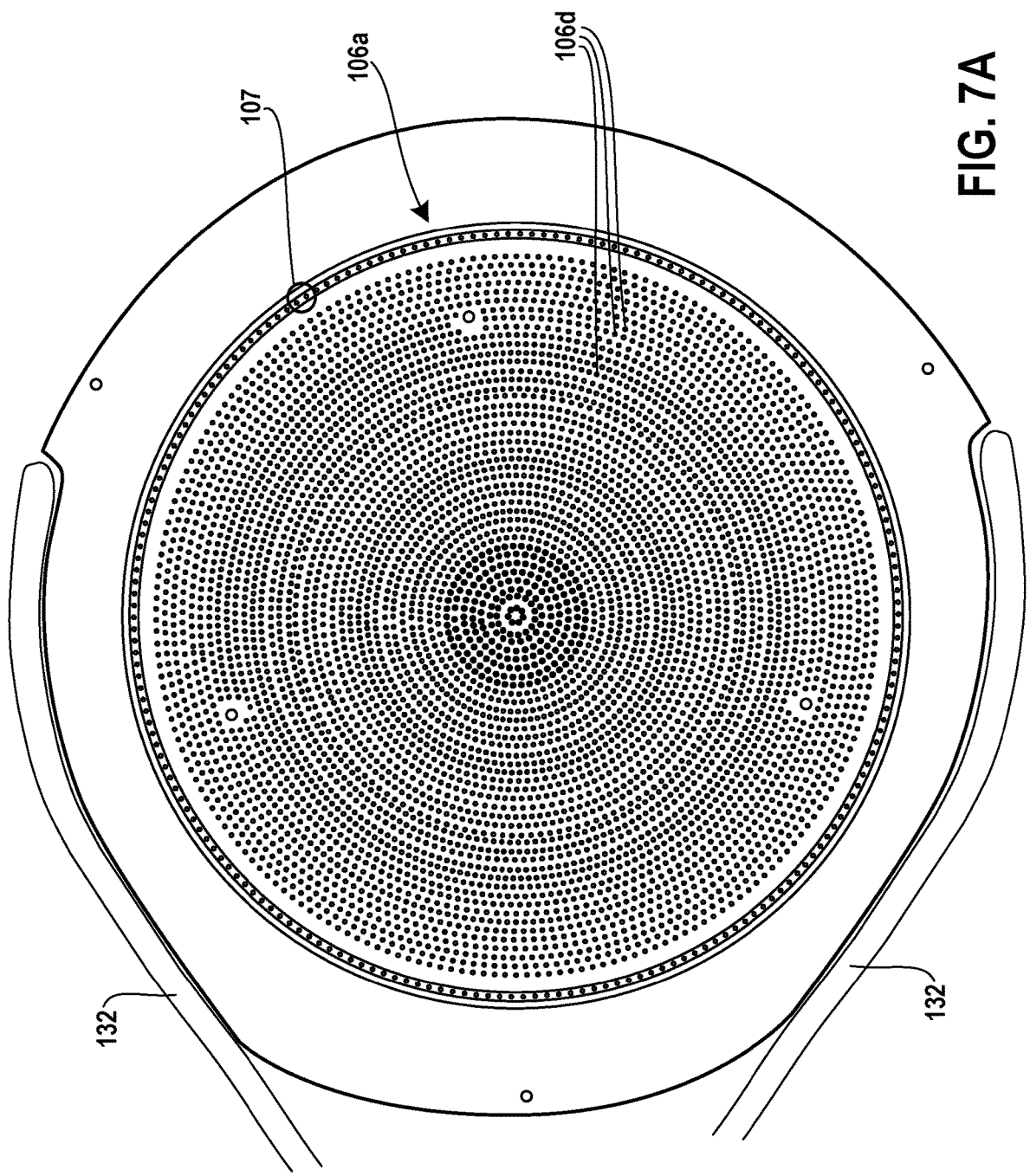
FIGS. 7A-7C show top views of the shower-pedestal, having concentric rings of orifices that the fine the whole pattern, and showing that various zones can be defined for different radius regions, including center radius regions middle radius regions outer radius regions and different segmentations, in accordance with some embodiments.

FIG. 7A illustrates a top view of the show-ped 106, with the hole patterns 106*a* having the concentric circles of orifices 106*d* extending from a center of the show-ped 106 to an outer periphery of the hole pattern 106 of the show-ped 106. As shown, at least one concentric circle of orifices 106*d* is defined along an edge hole region 107. As mentioned above, the edge hole region 107 is constructed so that orifices are angled away from the center, so that gases can be directed toward an edge of the substrate 128 when held by the carrier ring 124 above the show-ped 106, at the spaced apart relationship. Also shown in this example, is the spider forks 132, which are utilized to lift the carrier ring 124 to the separation distance, as shown in FIGS. 6A and 6B.

In one embodiment, the show-ped 106 will also include a heater, which is integrated therein to provide heating functions during top-side deposition. The heater elements can be distributed to provide even heating distribution, while still providing pass-through for the orifices 106d that deliver the gases during backside deposition.

As mentioned above, the separation distance between the top of the substrate 128 and the surface 104a of the showerhead 104 is preferably between about 2 mm and 0.5 mm, and in some embodiments between about 1 mm and about 0.5 mm, depending on the wafer bow. That is, if the wafer is bowed substantially, the separation will be greater than 0.5 mm. If the wafer is not yet bowed substantially, the separation can be less than 0.5 mm. in one embodiment, the separation distance between the backside of the substrate when held at the separation distance above the show-ped 106 is between about 8 mm and about 14 mm, and in one example, the separation distance between and underside of the substrate 128 and the top surface of the show-ped 106 is about 10 mm.

In some embodiments, the concentric rings that form the orifices in the show-ped 106 can also be separated into different zones. For example, an outer zone can be defined to apply one type of gas for depositing a particular type of material to the backside of the substrate while supplying a different gas combination to the center part of the backside of the substrate. By supplying different gases through the different zones of the orifices 106d, it is possible to target different regions of the substrate backside with different types of materials, different thicknesses, and different zones.

Figure 7B:
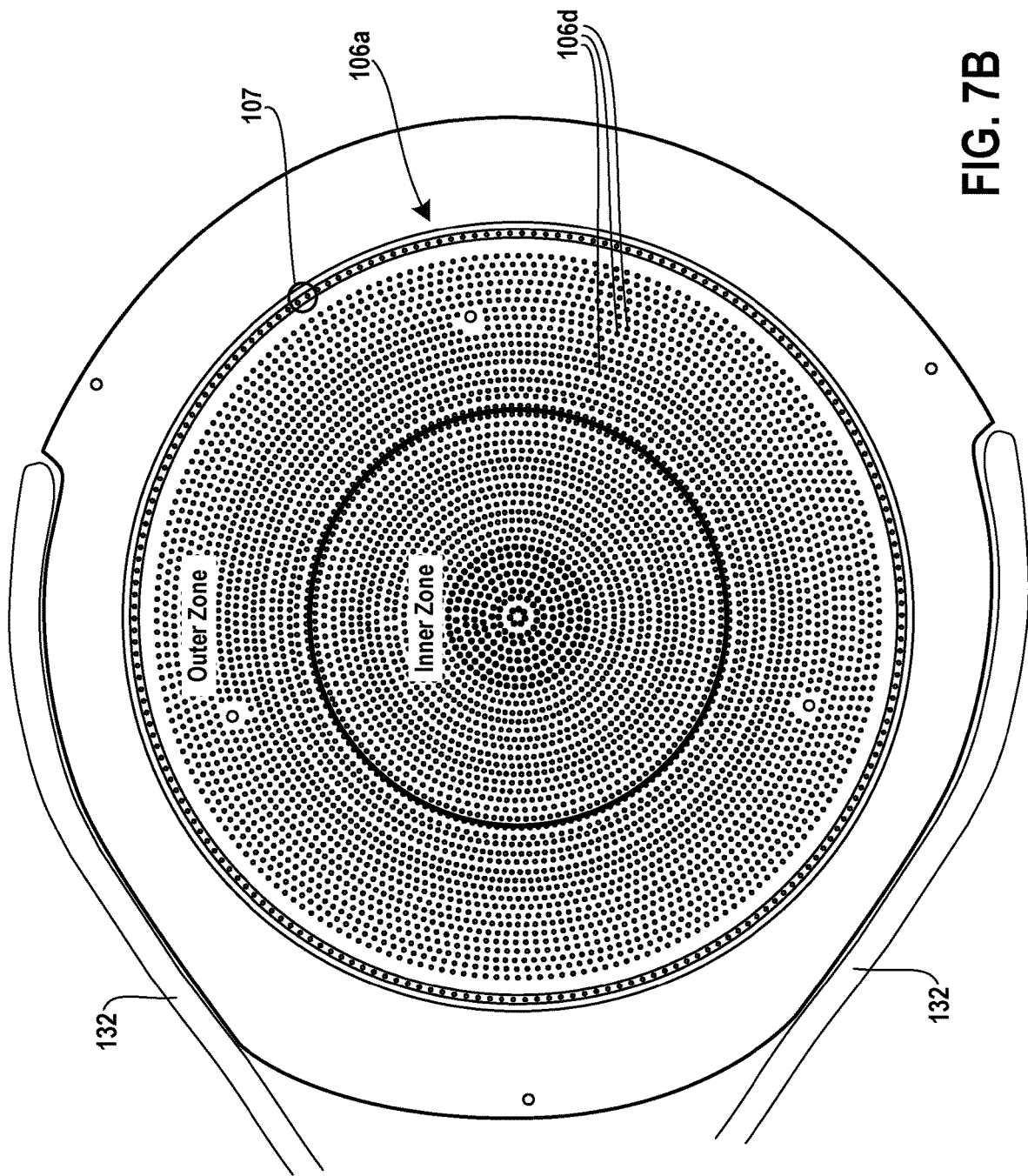
Figure 7C:
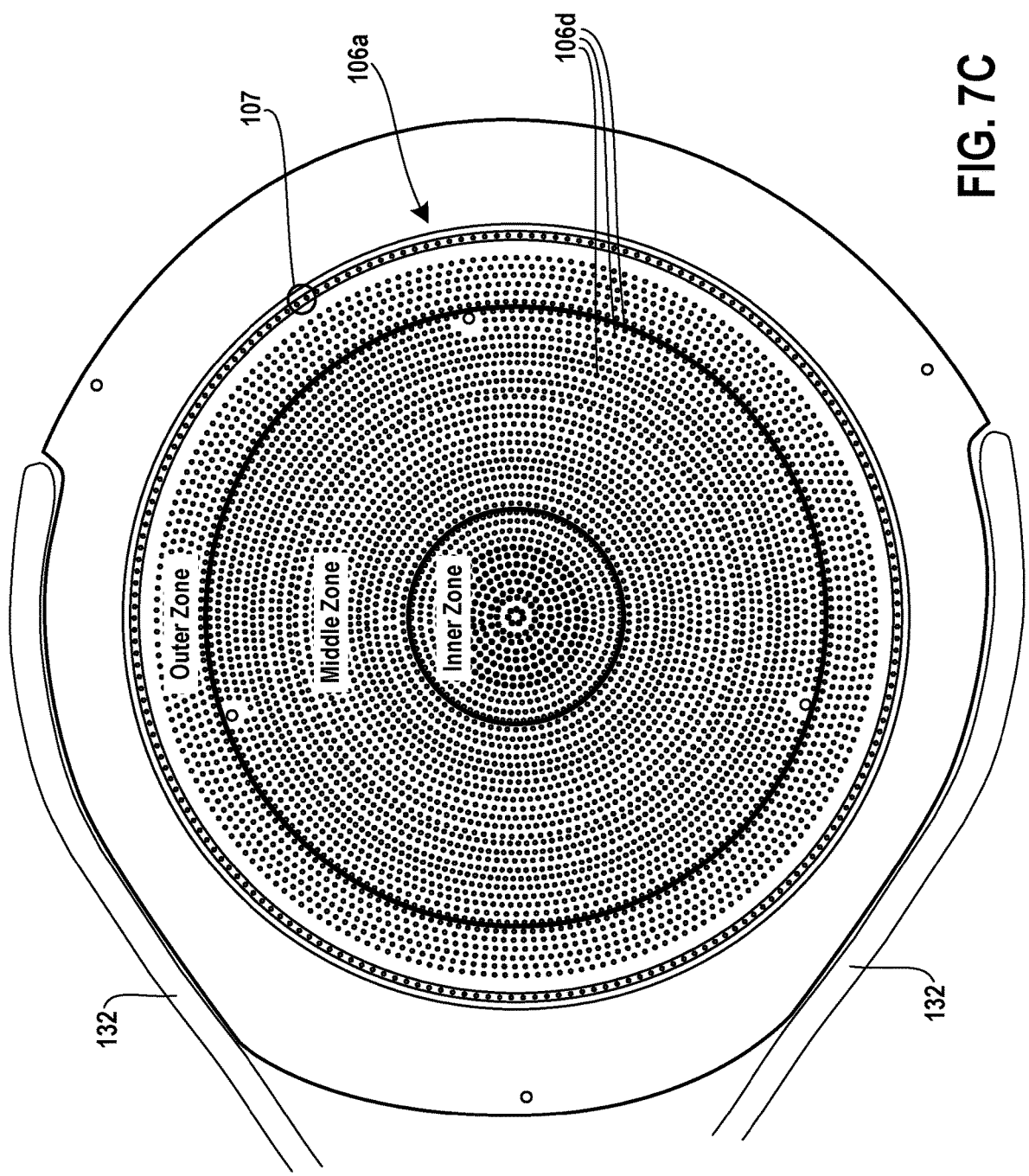

FIGS. 7B-7C illustrate how different zones can be defined. FIG. 7B shows an inner zone, which can be adjusted in or out, depending on the application, and an outer zone. FIG. 7C illustrates three zones, e.g., an inner zone, a middle zone and an outer zone.

In some embodiments, deposition gases can be output from an outer zone, which can include a number of concentric rings, while not flowing gases from the center region orifices. By doing this, it is possible to influence the thickness of the material deposited on the backside of the substrate, and combat strategically the warping caused by the material layers on the top surface of the substrate. In some embodiments, the show-ped 106 can include different orientations of zones other than concentric zones.

Other orientations of zones can also include providing zones in different quadrants, different slices of pie, different areas, etc., which can be individually controlled with different plenums disposed within the show-ped 106. Accordingly, it is envisioned that the orifices 106d and hole pattern 106a disposed in the show-ped 106 can be designed to deliver the same or different gases to different zones, to influence deposition of different and thicknesses on the backside of the substrate, to combat substrate warping caused by the multiple layers being fabricated on the top surface or topside of the substrate.

Figure 8:
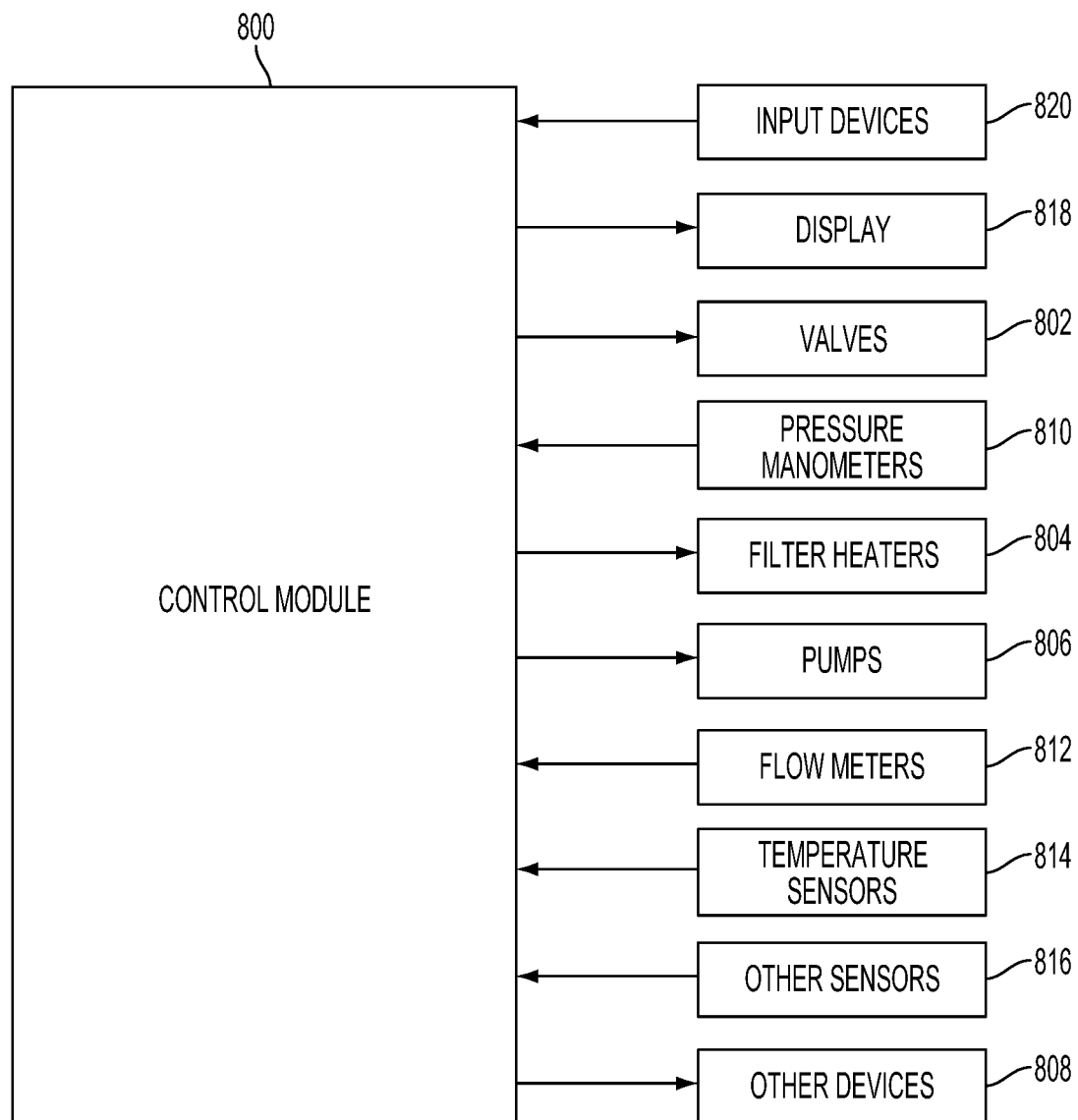
FIG. 8 shows a control module for controlling the systems, in accordance with one embodiment.

FIG. 8 shows a control module 800 for controlling the systems described above. In one embodiment, the control module 110 of FIG. 1 may include some of the example components. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during precursor delivery and deposition of the film. The control module 800 will typically include one or more memory devices and one or more processors.

The control module 800 may control activities of the precursor delivery system and deposition apparatus. The control module 800 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 810, and thermocouples located in delivery system, the pedestal or chuck (e.g. the temperature sensors 814). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A shower-pedestal for supplying processing gases to an underside of a wafer during semiconductor processing operations, the shower-pedestal comprising:
   a top surface;
   an enclosed plenum region located within the shower-pedestal;
   a plurality of orifices arranged on the top surface and connected to the enclosed plenum region; and
   a plurality of spacers, the spacers extending away from the top surface and configured to support a carrier ring thereover, wherein each spacer has a spacer top surface having a corresponding recessed region, each recessed region configured to receive a corresponding support extension projecting from the carrier ring that the spacers are configured to receive.

2. The shower-pedestal of claim 1, wherein:
   the orifices are arranged in a first hole pattern in an interior area of the top surface and in a second hole pattern that encircles the interior area, and
   the orifices in the first hole pattern extend along directions perpendicular to the top surface.

3. The shower-pedestal of claim 2, wherein the orifices in the second hole pattern extend along non-perpendicular angles relative to the top surface.

4. The shower-pedestal of claim 1, further comprising a gas entry path that leads to a baffle located within the enclosed plenum region.

5. The shower-pedestal of claim 4, wherein the orifices are distributed across an interior region of the top surface.

6. The shower-pedestal of claim 1, wherein the orifices are arranged in a plurality of concentric circular rings centered on a center of the shower-pedestal and extending to an outer region of the shower-pedestal.

7. The shower-pedestal of claim 6, wherein at least an outer ring of the orifices includes a plurality of angled orifices that are tilted away from perpendicular to the top surface and in a direction away from the center of the shower-pedestal.

8. The shower-pedestal of claim 1, wherein there are three spacers.

9. The shower-pedestal of claim 8, wherein the spacers each have one or more support surfaces configured to mate with support extensions on a carrier ring that the spacers are configured to support.

10. The shower-pedestal of claim 1, wherein the shower-pedestal further includes a plurality of lift pin holes, each lift pin hole configured to allow a corresponding lift pin to pass therethrough.

11. The shower-pedestal of claim 1, further comprising a plurality of lift pins, each lift pin configured to extend through a corresponding hole in the shower-pedestal.

* * * * *